(12) United States Patent
Gladnick et al.

(10) Patent No.: US 11,573,498 B2
(45) Date of Patent: Feb. 7, 2023

(54) FAST HIGH POWER PULSED LIGHT SOURCE SYSTEM FOR HIGH SPEED METROLOGY IMAGING

(71) Applicant: Mitutoyo Corporation, Kanagawa-ken (JP)

(72) Inventors: Paul Gerard Gladnick, Seattle, WA (US); Bjorn Erik Bertil Jansson, Snohomish, WA (US)

(73) Assignee: Mitutoyo Corporation, Kanagawa-ken (JP)

( * ) Notice: Subject to any disclaimer, the term of this patent is extended or adjusted under 35 U.S.C. 154(b) by 281 days.

(21) Appl. No.: 17/007,775

(22) Filed: Aug. 31, 2020

(65) Prior Publication Data

US 2021/0063897 A1 Mar. 4, 2021

Related U.S. Application Data

(60) Provisional application No. 62/894,277, filed on Aug. 30, 2019.

(51) Int. Cl.
*H05B 45/32* (2020.01)
*G03F 7/00* (2006.01)
*G03F 7/20* (2006.01)

(52) U.S. Cl.
CPC ......... *G03F 7/70758* (2013.01); *H05B 45/32* (2020.01)

(58) Field of Classification Search
None
See application file for complete search history.

(56) References Cited

U.S. PATENT DOCUMENTS 7,324,682 B2  1/2008  Wasserman
7,454,053 B2  11/2008  Bryll et al.
(Continued)

FOREIGN PATENT DOCUMENTS

EP    2 592 581 B1    1/2018

OTHER PUBLICATIONS

Binh et al., "Schottky-capacitance pulse-shaping circuit for high-speed light emitting diode operation," *Electronics Letters* 48(12), Jun. 7, 2012, 3 pages.
(Continued)

*Primary Examiner* — Dedei K Hammond
(74) *Attorney, Agent, or Firm* — Seed IP Law Group LLP

(57) ABSTRACT

A high-power fast-pulse driver and illumination system for high speed metrology imaging is provided, which includes an illumination source and a driver circuit configured to overdrive the illumination source using high currents and/or high current densities. The high currents are currents higher than manufacturer-recommended currents used to drive the illumination source and the high current densities are current densities higher than manufacturer-recommended current densities used to drive the illumination source. The illumination source is operated using a lifetime preserving technique selected from a first technique of operating the illumination source at low duty cycles of 2% or less or a second technique of operating the illumination source in a burst mode at higher duty cycles for short intervals. The driver and illumination system may be incorporated in a variable focus lens (VFL) system, to define multiple exposure increments for acquiring one or more images focused at one or more focus planes.

21 Claims, 14 Drawing Sheets

(56) References Cited

U.S. PATENT DOCUMENTS

| | | | |
|---|---|---|---|
| 7,570,795 | B2 | 8/2009 | Yu et al. |
| 7,627,162 | B2 | 12/2009 | Blanford et al. |
| 8,111,905 | B2 | 2/2012 | Campbell |
| 8,111,938 | B2 | 2/2012 | Bryll et al. |
| 8,194,307 | B2 | 6/2012 | Arnold et al. |
| 9,143,674 | B2 | 9/2015 | Gladnick |
| 9,213,175 | B2 | 12/2015 | Arnold |
| 9,256,009 | B2 | 2/2016 | Theriault et al. |
| 9,603,210 | B1 * | 3/2017 | Carlen .................. H05B 45/56 |
| 9,726,876 | B2 | 8/2017 | Bryll |
| 9,736,355 | B1 | 8/2017 | Bryll |
| 9,774,765 | B2 | 9/2017 | Bryll et al. |
| 9,830,694 | B2 * | 11/2017 | Bryll .................... H04N 5/2353 |
| 9,930,243 | B2 | 3/2018 | Gladnick et al. |
| 9,983,459 | B2 | 5/2018 | Arnold |
| 10,101,572 | B2 | 10/2018 | Bryll et al. |
| 10,151,962 | B2 | 12/2018 | Gladnick et al. |
| 10,178,321 | B2 | 1/2019 | Emtman et al. |
| 10,520,650 | B2 | 12/2019 | Freerksen et al. |
| 2006/0076160 | A1 | 4/2006 | Hsu et al. |
| 2006/0211802 | A1 | 9/2006 | Asgari |
| 2010/0137990 | A1 | 6/2010 | Apatsidis et al. |
| 2016/0025903 | A1 | 1/2016 | Arnold |
| 2017/0052425 | A1 | 2/2017 | Arnold |
| 2017/0078549 | A1 | 3/2017 | Emtman et al. |
| 2018/0143419 | A1 | 5/2018 | Bryll et al. |
| 2018/0180773 | A1 | 6/2018 | Usami et al. |
| 2019/0104302 | A1 * | 4/2019 | Gladnick ........... G02B 21/0016 |
| 2020/0094407 | A1 | 3/2020 | Nahum et al. |

OTHER PUBLICATIONS

Electrical Engineering Stack Exchange, "Can a Zener diode that protects a switch against inductance when the switch opens, affect turn on speed of the valve when you close it again?"—question asked May 23, 2015 and the resulting discussion. (9 pages).

Freerksen et al., "External Reservoir Configuration for Tunable Acoustic Gradient Lens," U.S. Appl. No. 16/000,319, filed Jun. 5, 2018, 43 pages.

"GaN Transistors for Efficient Power Conversion; Chapter 1: Gallium Nitride (GaN) Technology Overview," copyright EPC 2012, 12 pages.

International Search Report and Written Opinion, dated Jan. 12, 2021, 11 pages.

Lubsandorzhiev, "LED based powerful nanosecond light sources for calibration systems of deep underwater neutrino telescopes," VLVnT08, Apr. 24, 2008, 17 pages.

Mermillod-Blondin et al., "High-speed varifocal imaging with a tunable acoustic gradient index of refraction lens," *Optics Letters* 33(18) pp. 2146-2148, 2008. (3 pages).

OSRAM Opto Semiconductors, "High-Speed Switching of IR-LEDs (Part I) Background and Datasheet Definition," Application Note No. AN096, Mar. 2014, 7 pages.

Phototonics Media, "Photonics Spectra; 2019 Trends: Optics, Lasers, Spectroscopy," p. 92, Jan. 2019. (2 pages).

Ronchi et al., "A bipolar LED drive technique for high performance, stability and power in the nanosecond time scale," *Nuclear Instruments and Methods in Physics Research A* 599, pp. 243-247, 2009. (5 pages).

Rose et al., "Driving LED in a Nanosecond Regime by a Fast Operational Amplifier," Department of Physics and Astronomy, Faculty of Mathematics and Physical Sciences, University of Leeds, Jul. 31, 2009, 9 pages.

Smart Vision Lights, "Smart Vision Lights Launches NanoDrive™ Technology at Automate 2019 to Support High-Speed Image Capture and Shorter Exposure Times," Press Release, Apr. 8, 2019, 2 pages.

Veledar et al., "Review and Development of Nanosecond Pulse Generation for Light Emitting Diodes," 4 pages.

Willert et al., "High Speed Imaging of Fuel Sprays Using a Low-Cost Illumination Source," Paper ID ILASS08-P-15, ILASS 2008, Como Lake, Italy, Sep. 8-10, 2008, 4 pages.

Willert et al., "Pulsed operation of high-power light emitting diodes for imaging flow velocimetry," *Meas. Sci. Technol.* 21, 2010, 12 pages.

Willert et al., "Megahertz Schlieren Imaging of Shock Structure and Sound Waves in Under-Expanded, Impinging Jets," Jun. 28, 2013, 3 pages.

Yoshizawa, "Handbook of Optical Metrology: Principles and Applications, Second Edition," p. 64. (1 page).

* cited by examiner

501 — providing a smart lighting pulse control routine/circuit (SLPCRC) that provides a first mode of exposure control corresponding to a points from focus (PFF) mode of a TAG lens imaging system and a second mode of exposure control corresponding to an extended depth of focus (EDOF) mode of the TAG lens imaging system 503 — placing a workpiece in a field of view of the TAG lens imaging system 505 — periodically modulating a focus position of the TAG lens imaging system without macroscopically adjusting the spacing between elements in the TAG lens imaging system, wherein the focus position is periodically modulated over a plurality of focus positions along a focus axis direction in a focus range including a surface height of the workpiece, at a modulation frequency of at least 30 kHz 507 — operating the TAG lens imaging system by activating the PFF mode at a first operating period or time 509 — operating the TAG lens imaging system by activating the EDOF mode at a second operating period or time

*Fig. 5*

FAST HIGH POWER PULSED LIGHT SOURCE SYSTEM FOR HIGH SPEED METROLOGY IMAGING

CROSS-REFERENCE TO RELATED APPLICATION(S)

This application claims priority to U.S. Provisional Application No. 62/894,277, filed Aug. 30, 2019, the entire disclosure of which is incorporated herein by reference.

FIELD

The invention relates generally to high speed metrology imaging, and more particularly to pulsed illumination systems for high-speed imaging and/or sensing operations.

BACKGROUND

In various optically-based measurement or sensing systems, the throughput and/or accuracy and/or resolution depend on how short of an exposure time can be used. This is well understood with respect to imaging systems that use short illumination pulses ("strobe" lighting) to freeze motion and/or isolate the imaged scene to an instant in time. For example, freezing motion reduces the motion-induced blur of edges in the image and allows related edge and distance measurements, and derived measurements, to be more accurate, e.g. in X, Y directions in an image. In addition to freezing X, Y motion, there is also a need to freeze Z axis motion, that is motion along the optical axis of an imaging or sensing system, e.g. at the instant that the focus plane of an optical system coincides with the plane of a surface or feature to be imaged. It will be appreciated that relative motion between a focus plane can arise for motion of the object, or "motion" of the focus plane of the optical system, e.g. due to the use of variable focus lens (VFL) in the optical system. One particularly fast VFL lens that requires a particularly fast illumination system in order to best utilize its capabilities is a tunable acoustic gradient or TAG lens, which periodically varies it optical power (or focal distance of an optical system) at 70 KHz or more.

For example, a system can use a TAG lens to image at different focus planes, in order to acquire well focused images that support accurate machine vision measurements or inspection at individual imaging planes, or to acquire an "image stack" systematically, throughout a measurement volume. Generally speaking, the brighter and shorter an illumination pulse available to be used in such systems, the greater their acquisition and measurement speed, the greater their versatility for measuring dark, moving or vibrating workpieces, and the better their measuring accuracy and resolution. Other potentially valuable uses of shorter pulse illumination systems include variable focus light projection systems, LIDAR systems, certain types of autofocus systems, certain types of plenoptic camera systems, and others.

In order to achieve fast illumination pulses, it is known to drive one or more LEDs using a driver circuit that can deliver pulses on the order of several watts (e.g. on the order of 10 watts, or so) in combination with a few microseconds in length. However, even the fastest known such driver circuits and illumination pulses (at least those that are compact and versatile enough for a variety of industrial applications, in a practical and acceptable industrial price range) remain the limiting factor related to the speed, versatility and accuracy of various systems, especially of TAG lens based systems. Driver circuits and illumination systems that can provide brighter and/or shorter illumination pulses would be desirable.

SUMMARY

A high-power fast-pulse driver and illumination system is disclosed. The driver and illumination system is particularly useful for overdriving an LED, to provide incoherent illumination, though the driver and illumination system may be used in combination with other devices in some applications.

A high-power fast-pulse driver and illumination system for high speed metrology imaging is provided, which includes an illumination source and a driver circuit configured to overdrive the illumination source using high currents and/or high current densities. The high currents are currents higher than manufacturer-recommended currents used to drive the illumination source and the high current densities are current densities higher than manufacturer-recommended current densities used to drive the illumination source. The illumination source is configured to be operated using a lifetime preserving technique selected from a first technique of operating the illumination source at low duty cycles of 2% or less or a second technique of operating the illumination source in a burst mode at higher duty cycles for short intervals.

According to one aspect, the driver circuit includes:

node N1 coupled to a power supply;

node N2, coupled via an inductor L12 to node N1, and providing an anode for the illumination source;

node N3, coupled via one or more capacitors C23 to node N2, and providing an input to receive control pulses for driving the illumination source;

node N4, coupled via element E43 to node N3, coupled via one or more diodes D42 to node N2, and providing a cathode for the illumination source; and node N5, coupled to a gate trigger circuit GTS for receiving pulse control signals PULSE IN for driving the illumination source, and coupled via one or more transistors T543 to node N4 and to node N3.

According to a further aspect, the one or more transistors T543 comprise Gallium Nitride FETs.

According to another aspect, the driver circuit is configured to perform pulse control to limit pulse width(s) of the pulse control signals PULSE IN to safe level(s) in case of an over-current instance.

According to another aspect, the driver circuit is configured to switch from operating in a higher pulse rate mode and to operating in a slower pulse rate mode in case of an over-current instance.

According to another aspect, the driver and illumination system is incorporated in a variable focus lens (VFL) system, wherein the driver and illumination system, in operation, defines multiple exposure increments for acquiring a single image focused at multiple focus planes of the VFL system, or multiple images focused at multiple focus planes of the VFL system, or a single image focused at a single focus plane of the VFL system.

According to another aspect, the VFL system is a tunable acoustic gradient (TAG) lens system.

According to another aspect, a change in focal plane during one of the exposure increments is on the order of 0.2 to 0.25 of a depth of focus (DOF) of the VFL system.

According to another aspect, a pulse length corresponding to one of the exposure increments is in a range of 12-80 nanoseconds.

According to another aspect, a pulse length corresponding to one of the exposure increments is 10 nanoseconds.

According to another aspect, the illumination source comprises one or more light emitting diodes (LEDs).

According to another aspect, the LEDs respectively have an emitter area of at least 9 mm$^2$ with a current density of 5-12 A/mm2.

According to another aspect, the illumination source is driven with a power supply on the order of 24 volts or less.

According to another aspect, the power supply is on the order of 21 volts.

According to another aspect, the driver and illumination system is implemented in a printed circuit board (PCB) layout configuration having particular configurations of individual components and layout with respect to one another in layers in 3 dimensions.

According to another aspect, at least some of node traces are configured as plate or planar configurations that occupy as much as 5% or 10% of a total footprint of the PCB layout configuration.

According to another aspect, at least some of node traces are configured to extend under components that the node traces connect to, as viewed in a direction perpendicular to a plane of the PCB layout configuration.

According to another aspect, different node traces that carry respective currents that flow along partially or wholly opposite directions are located on layers that are relatively closer to one another, as viewed in a direction perpendicular to a plane of the PCB layout configuration; and different node traces that carry respective currents that flow along similar directions are located on layers that are relatively farther from one another, as viewed in the direction perpendicular to the plane of the PCB layout configuration.

In some implementations, the driver and illumination system disclosed herein may be used in combination with high-speed metrology imaging systems and/or other systems, some of which may include a TAG lens type VFL. The driver and illumination systems disclosed herein may be used to control such systems including a TAG lens type VFL, to enhance the performance or versatility of those systems.

A method for operating a tunable acoustic gradient (TAG) lens imaging system is provided, which include generally three steps including:

(i) providing a smart lighting pulse control routine/circuit (SLPCRC) that provides a first mode of exposure control corresponding to at least one of a points from focus (PFF) mode of the TAG lens imaging system or a second mode of exposure control corresponding to an extended depth of focus (EDOF) mode of the TAG lens imaging system, wherein the SLPCRC includes: an illumination source; and a driver circuit configured to overdrive the illumination source using high currents and/or high current densities, wherein the high currents are currents higher than manufacturer-recommended currents used to drive the illumination source and the high current densities are current densities higher than manufacturer-recommended current densities used to drive the illumination source;

(ii) placing a workpiece in a field of view of the TAG lens imaging system; and (iii) operating the TAG lens imaging system by:
activating the PFF mode or the EDOF mode,
periodically modulating a focus position of the TAG lens imaging system over a plurality of focus positions along a focus axis direction in a focus range including a surface height of the workpiece, and controlling the SLPCRC to define a plurality of exposure increments for acquiring a single image focused at the plurality of focus positions, or a plurality of images focused at the plurality of focus positions, respectively, or a single image focused at a single focus position.

BRIEF DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein:

FIG. 5 is a flow diagram showing one embodiment of a method for operating a TAG lens imaging system including the SLPCRC that provides a first mode of exposure corresponding to a PFF mode, and a second mode of exposure control corresponding to an EDOF mode;

DETAILED DESCRIPTION

Figure 1:
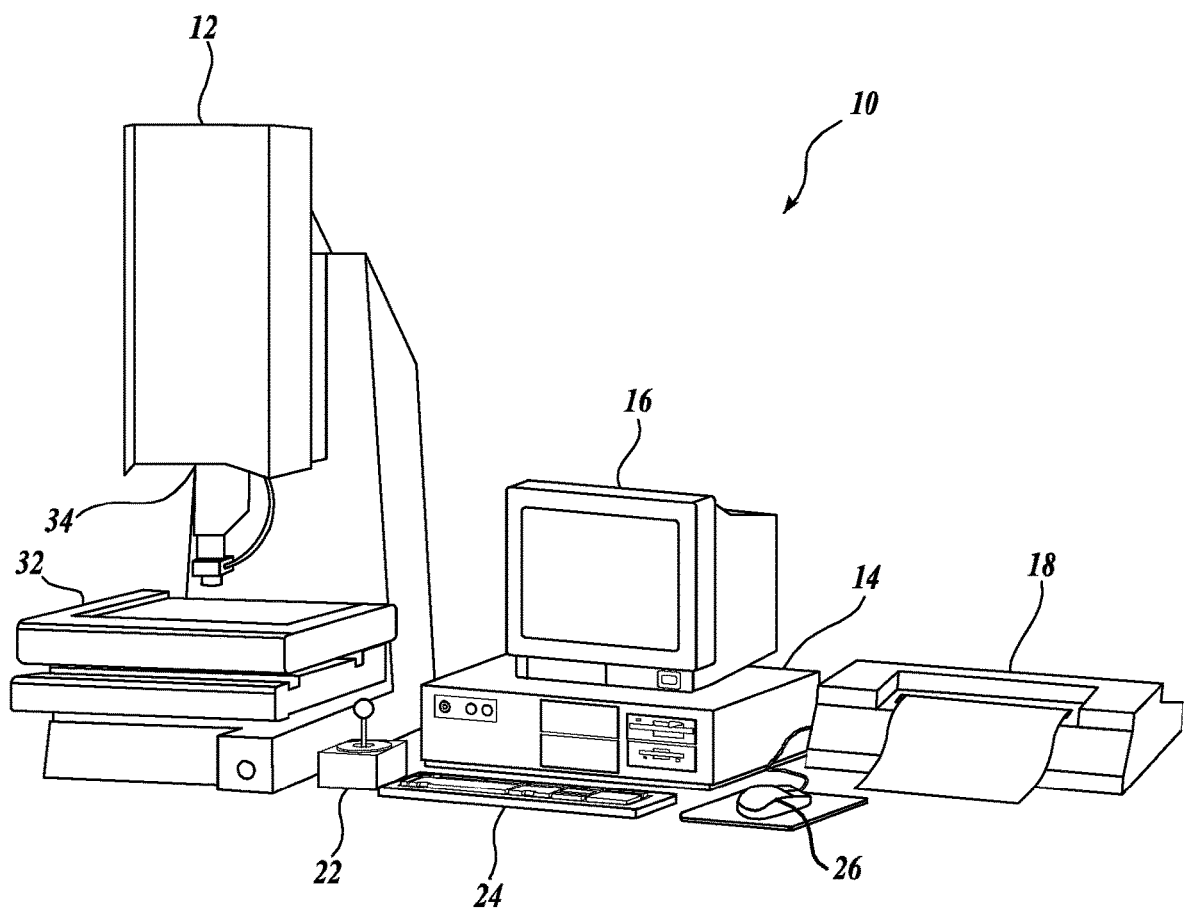
FIG. 1 is a diagram showing various typical components of a general-purpose precision machine vision inspection system, suitable for incorporating a TAG lens imaging system including a high-power fast-pulse driver and illumination system according to exemplary embodiments.

FIG. 1 is a block diagram of one exemplary machine vision inspection system 10 suitable for incorporating a VFL imaging system 10, such as a TAG lens imaging system 10, including a high-power fast pulse driver and illumination system in accordance with principles described herein. As used herein, to the extent that the machine vision inspection system incorporates or embodies the TAG lens imaging system, the machine vision inspection system and the TAG lens imaging system are represented by the same reference numeral 10 and may be interchangeably used. The machine vision inspection system 10 includes a vision measuring machine 12 that is operably connected to exchange data and control signals with a controlling computer system 14. The controlling computer system 14 is further operably connected to exchange data and control signals with a monitor or display 16, a printer 18, a joystick 22, a keyboard 24, and a mouse 26. The monitor or display 16 may display a user interface suitable for controlling and/or programming the operations of the machine vision inspection system 10. It will be appreciated that in various embodiments, a touchscreen tablet or the like may be substituted for and/or redundantly provide the functions of any or all of the computer system 14, the display 16, the joystick 22, the keyboard 24, and the mouse 26.

Those skilled in the art will appreciate that the controlling computer system 14 may generally consist of any computing system or device. Suitable computing systems or devices may include personal computers, server computers, minicomputers, mainframe computers, distributed computing environments that include any of the foregoing, and the like. Such computing systems or devices may include one or more processors that execute software to perform the functions described herein. Processors include programmable general-purpose or special-purpose microprocessors, programmable controllers, application-specific integrated circuits (ASICs), programmable logic devices (PLDs), or the like, or a combination of such devices. Software may be stored in memory, such as random-access memory (RAM), read-only memory (ROM), flash memory, or the like, or a combination of such components. Software may also be stored in one or more storage devices, such as optical-based disks, flash memory devices, or any other type of nonvolatile storage medium for storing data. Software may include one or more program modules that include routines, programs, objects, components, data structures, and so on that perform particular tasks or implement particular abstract data types. In distributed computing environments, the functionality of the program modules may be combined or distributed across multiple computing systems or devices and accessed via service calls, either in a wired or wireless configuration.

The vision measuring machine 12 includes a moveable workpiece stage 32 and an optical imaging system 34 that may include a zoom lens or interchangeable lenses. The zoom lens or interchangeable lenses generally provide various magnifications for the images provided by the optical imaging system 34. The machine vision inspection system 10 is also described in commonly assigned U.S. Pat. Nos. 7,454,053; 7,324,682; 8,111,905; and 8,111,938, each of which is incorporated herein by reference in its entirety.

Figure 2:
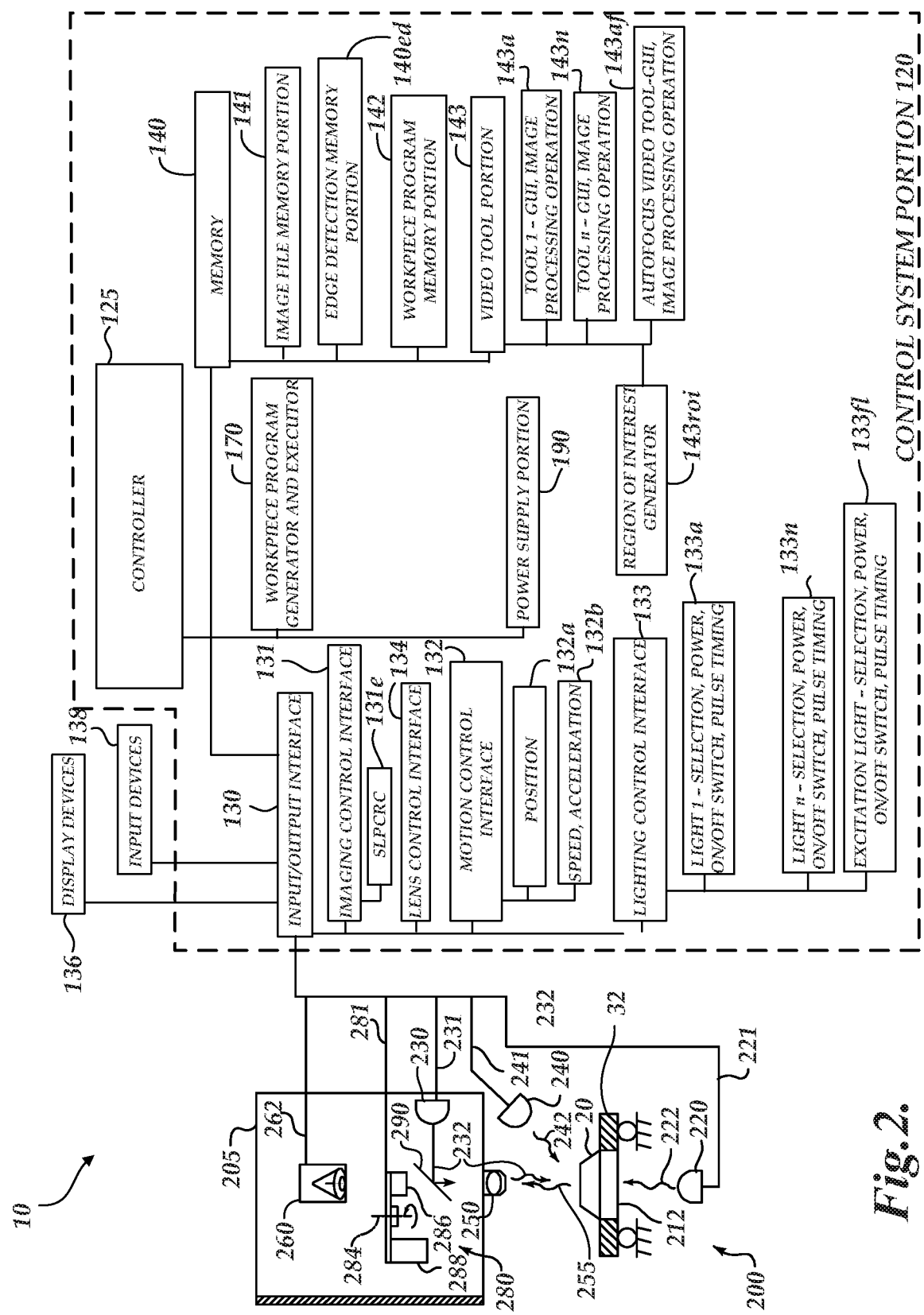
FIG. 2 is a block diagram of a control system portion and a vision components portion of a machine vision inspection system incorporating the TAG lens imaging system similar to that of FIG. 1 and including features disclosed herein.

FIG. 2 is a block diagram of a control system portion 120 and a vision components portion 200 of a machine vision inspection system 10 similar to the machine vision inspection system of FIG. 1, and including features as described herein. As will be described in more detail below, the control system portion 120 is utilized to control the vision components portion 200. The vision components portion 200 includes an optical assembly portion 205, light sources 220, 230, and 240 (e.g., a strobe illumination light source formed of one or more light emitting diodes LEDs), and a workpiece stage 32 having a central transparent portion 212. The workpiece stage 32 is controllably movable along X and Y axes that lie in a plane that is generally parallel to the surface of the stage where a workpiece 20 may be positioned. The optical assembly portion 205 includes a camera system 260, and an objective lens system 250. According to various embodiments, the objective lens system 250 comprises a tunable acoustic gradient (TAG) lens having a variable focal length, as will be more fully described below. The optical assembly portion 205 may also include a turret lens assembly 280 having lenses 286 and 288. Alternatively to the turret lens assembly, a fixed or manually interchangeable magnification-altering lens, or a zoom lens configuration, or the like, may be included.

A workpiece 20, or a tray or fixture holding a plurality of workpieces 20, which is to be imaged using the machine vision inspection system 10, is placed on the workpiece stage 32. The workpiece stage 32 may be controlled to move relative to the optical assembly portion 205, such that the objective lens system 250 comprising a TAG lens moves between locations on a workpiece 20, and/or among a plurality of workpieces 20. One or more of a stage light 220, a coaxial light 230, and a surface light 240 (e.g., a strobe illumination light source formed of one or more LEDs) (collectively light sources) may emit source light 222, 232, and/or 242, respectively, to illuminate the workpiece or workpieces 20. The light source 230 may emit light 232 along a path including a mirror 290. The source light is reflected or transmitted as workpiece light 255, and the workpiece light used for imaging passes through the objective lens system 250 comprising the TAG lens and the turret lens assembly 280 and is gathered by the camera system 260. The image of the workpiece(s) 20, captured by the camera system 260, is output on a signal line 262 to the control system portion 120. The light sources 220, 230, and 240 may be connected to the control system portion 120 through signal lines or busses 221, 231, and 241, respectively. To alter the image magnification, the control system portion 120 may rotate the turret lens assembly 280 along axis 284 to select a turret lens through a signal line or bus 281.

As shown in FIG. 2, in various exemplary embodiments, the control system portion 120 includes a controller 125, the input/output interface 130, a memory 140, a workpiece program generator and executor 170, and a power supply portion 190. Each of these components, as well as the additional components described below, may be interconnected by one or more data/control busses and/or application programming interfaces, or by direct connections between the various elements.

The input/output interface 130 includes an imaging control interface 131, a motion control interface 132, a lighting control interface 133, and a lens control interface 134. The imaging control interface 131 may include a smart lighting pulse control routine/circuit (SLPCRC) 131e, which includes or embodies a high-power fast-pulse driver and illumination system 410 (see FIG. 4) according to principles disclosed herein, and which provides a first mode of exposure control corresponding to the PFF mode of the TAG lens imaging system and a second mode of exposure control corresponding to the EDOF mode of the TAG lens imaging system. The lens control interface 134 may comprise a lens controller including a lens focus driving routine/circuit, lens focus timing routine/circuit, lens focus calibration routine/circuit, or the like. In various implementations, the lens controller generates master timing signal 409 (see FIG. 4) which controls the operation of the driver and illumination system 410 of the SLPCRC 131e according to principles disclosed herein. The operations and components associated with the SLPCRC 131e including the driver and illumination system 410 are described further below with reference to FIGS. 3-9.

The motion control interface 132 may include a position control element 132a, and a speed/acceleration control element 132b although such elements may be merged and/or indistinguishable.

The lighting control interface 133 includes lighting control elements 133a, 133n, and 133fl that control, for example, the selection, power, on/off switch, and strobe pulse timing for the various corresponding light sources of the machine vision inspection system 10. For example, the lighting control elements 133a, 133n, or 133fl may be part of the driver and illumination system (410 in FIG. 4) that controls a strobe illumination light source (e.g., LEDs) of the TAG lens imaging system 10. In various embodiments, at least a portion of the SLPCRC 131e may be included in such driver and illumination system 410 of the TAG lens imaging system, as will be more fully described below in reference to FIG. 4.

The memory 140 may include an image file memory portion 141, an edge-detection memory portion 140ed, a workpiece program memory portion 142 that may include one or more part programs, or the like, and a video tool portion 143. The video tool portion 143 includes video tool portion 143a and other video tool portions (e.g., 143n) that determine the GUI, image-processing operation, etc., for each of the corresponding video tools, and a region of interest (ROI) generator 143roi that supports automatic, semi-automatic, and/or manual operations that define various ROIs that are operable in various video tools included in the video tool portion 143. The video tool portion also includes an autofocus video tool 143af that determines the GUI, image-processing operation, etc., for focus height measurement operations. In the context of this disclosure, and as known by one of ordinary skill in the art, the term "video tool" generally refers to a relatively complex set of automatic or programmed operations that a machine vision user can implement through a relatively simple user interface (e.g., a graphical user interface, editable parameter windows, menus, and the like), without creating the step-by-step sequence of operations included in the video tool or resorting to a generalized text-based programming language, or the like. For example, a video tool may include a complex pre-programmed set of image-processing operations and computations that are applied and customized in a particular instance by adjusting a few variables or parameters that govern the operations and computations. In addition to the underlying operations and computations, the video tool comprises the user interface that allows the user to adjust those parameters for a particular instance of the video tool. For example, many machine vision video tools allow a user to configure a graphical region of interest (ROI) indicator through simple "handle dragging" operations using a mouse, in order to define the location parameters of a subset of an image that is to be analyzed by the image-processing operations of a particular instance of a video tool. It should be noted that the visible user interface features are sometimes referred to as the video tool with the underlying operations being included implicitly.

The signal lines or busses 221, 231, and 241 of the stage light 220, the coaxial light 230, and the surface light 240, respectively, are all connected to the input/output interface 130. The signal line 262 from the camera system 260 is connected to the input/output interface 130. In addition to carrying image data, the signal line 262 may carry a signal from the controller 125 that initiates image acquisition.

One or more display devices 136 (e.g., the display 16 of FIG. 1) and one or more input devices 138 (e.g., the joystick 22, keyboard 24, and mouse 26 of FIG. 1) can also be connected to the input/output interface 130. The display devices 136 and input devices 138 can be used to display a user interface that may include various graphical user interface (GUI) features that are usable to perform 3D measurement or inspection operations, and/or to create and/or modify part programs, to view the images captured by the camera system 260, and/or to directly control the vision components portion 200. The display devices 136 may display user interface features associated with the SLPCRC 131e, as will be more fully described below in reference to FIGS. 7 and 9.

In various exemplary embodiments, when a user utilizes the machine vision inspection system 10 to create a part program for the workpiece 20, the user generates part program instructions by operating the machine vision inspection system 10 in a learn mode to provide a desired image-acquisition training sequence. For example, a training sequence may comprise positioning a particular workpiece feature of a representative workpiece in the field of view (FOV), setting light levels, focusing or autofocusing, acquiring an image, and providing an inspection training sequence applied to the image (e.g., using an instance of one of the video tools on that workpiece feature). The learn mode operates such that the sequence(s) are captured or recorded and converted to corresponding part program instructions. These instructions, when the part program is executed, will cause the machine vision inspection system to reproduce the trained image acquisition and cause inspection operations to automatically inspect that particular workpiece feature (that is the corresponding feature in the corresponding location) on a run mode workpiece, or workpieces, which matches the representative workpiece used when creating the part program. The systems and methods using the SLPCRC (smart light pulse control routine/circuit) disclosed herein are useful during such learn mode and/or manual operations, in that a user may see a PFF 3 dimensional image or an EDOF video image in real time while navigating a workpiece for visual inspection and/or workpiece program creation. The user need not continually refocus high-magnification images depending on the height of various microscopic features on the workpiece, which can be tedious and time-consuming, especially at high magnifications.

The description of FIGS. 3 and 4 below explains various operating principles and applications of the TAG lens imaging system 10 including a TAG lens. Further explanation and understanding, and various aspects of such operating principles and applications, are described in greater detail in U.S. Pat. Nos. 9,930,243; 9,736,355; 9,726,876; 9,143,674; 8,194,307; 7,627,162; and US Patent Application Publication Nos. 2017/0078549; 2018/0143419, each of which is hereby incorporated herein by reference in its entirety.

Figure 3:
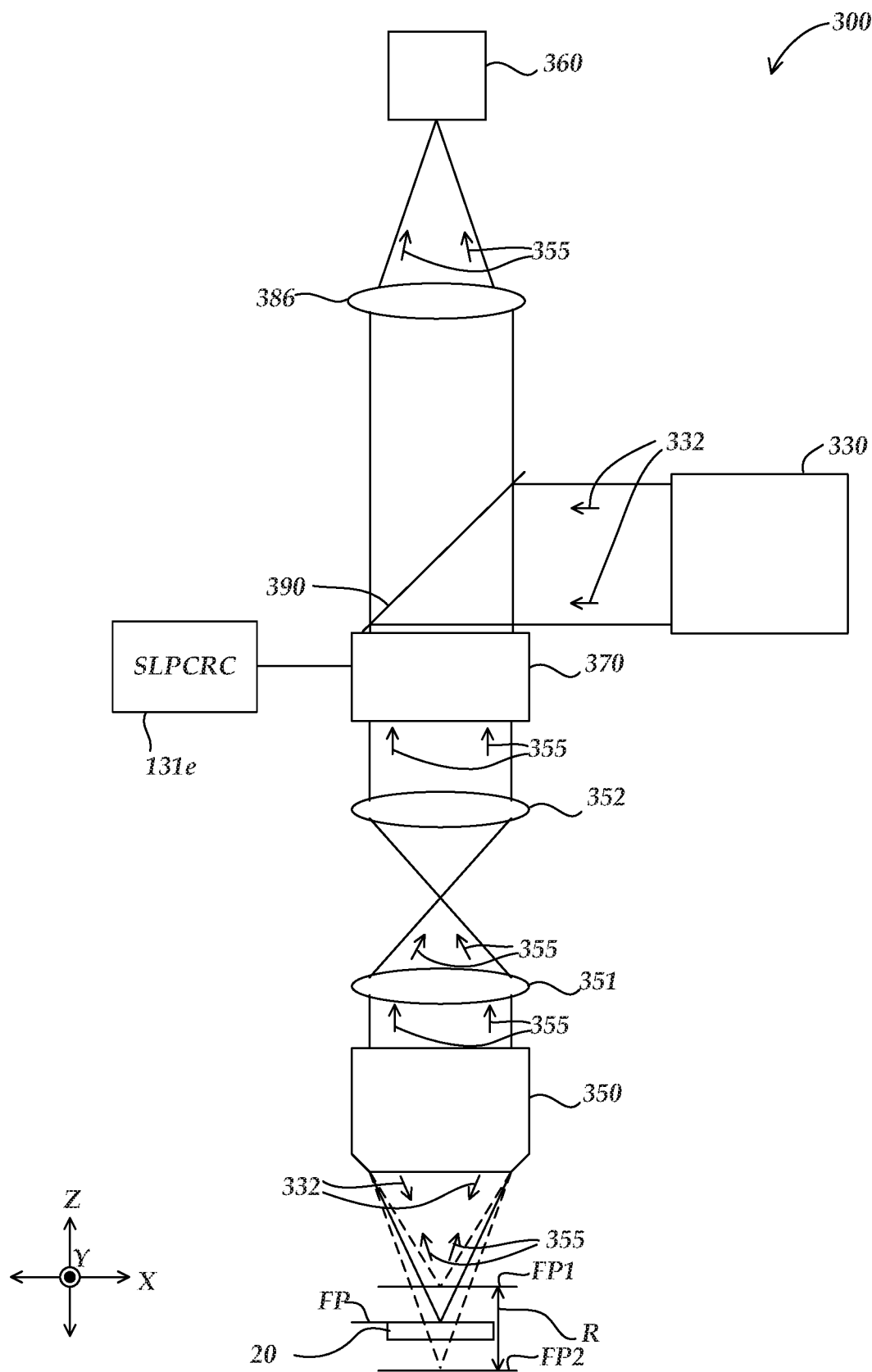
FIG. 3 shows a schematic diagram of one embodiment of the TAG lens imaging system including a TAG lens, which may be adapted to a machine vision inspection system and operated according to the principles disclosed herein.

FIG. 3 is a schematic diagram of one embodiment of a TAG lens imaging system 300 that may be adapted to a machine vision inspection system 10 and operated according to the principles disclosed herein. The TAG lens imaging system 300 comprises a light source 330 (e.g., a strobe illumination light source) that is configurable to illuminate a workpiece 20 in a field of view of the TAG lens imaging system 300, an objective lens 350, a relay lens 351, a relay lens 352, a TAG lens 370 having a variable focal length, a tube lens 386, and a camera system 360. The TAG lens (or interchangeably called a TAG index of refraction lens) 370 is a high-speed variable focal length lens that uses sound waves in a fluid medium to modulate a focus position and may periodically sweep a range of focal lengths at a high frequency. Such a lens may be understood by the teachings of the article, "High-speed varifocal imaging with a tunable acoustic gradient index of refraction lens" (Optics Letters, Vol. 33, No. 18, Sep. 15, 2008), which is hereby incorporated by reference in its entirety. TAG gradient index lenses and related controllable signal generators are available, for example, from TAG Optics, Inc., of Princeton, N.J. The SR38 series lenses available from TAG Optics, for example, are capable of modulation up to 1.0 MHz.

In operation, the light source 330 is configurable to emit source light 332 along a path including a mirror 390 to a surface of the workpiece 20. The objective lens 350 receives workpiece light 355 including workpiece light that is focused at a focus position FP proximate to the workpiece 20, and outputs the workpiece light 355 to the relay lens 351. The relay lens 351 receives the workpiece light 355 and outputs it to the relay lens 352. The relay lens 352 receives the workpiece light 355 and outputs it to the TAG lens 370. Together, the relay lens 351 and the relay lens 352 provide a 4f optical relay between the objective lens 350 and the TAG lens 370 in order to provide constant magnification for each Z height of the workpiece 20 and/or focus position FP. The TAG lens 370 receives the workpiece light 355 and outputs it to the tube lens 386. The TAG lens 370 is electronically controllable to vary the focus position FP of the TAG lens imaging system 300 during one or more image exposures. The focus position FP may be moved within a range R bound by a focus position FP1 and a focus position FP2. In some embodiments, the range R may be as large as 10 mm (for a 1× objective lens 350). It should be appreciated that in some embodiments, the range R may be selected by a user, e.g., in the PFF mode or in the EDOF mode as supported by the SLPCRC 131e.

In various embodiments, the TAG lens imaging system 300 comprises the smart lighting pulse control routine/circuit (SLPCRC) 131e that is configured to control the TAG lens 370 to periodically modulate the focus position FP of the TAG lens imaging system 300 without macroscopically adjusting the spacing between elements in the TAG lens imaging system 300. That is, the distance between the objective lens 350 and the workpiece 20 need not be adjusted in order to change the focus position FP. The focus position FP is periodically modulated over a plurality of focus positions along a focus axis direction in the focus range R including a surface height of the workpiece 20 that is being measured/imaged, at a modulation frequency of at least 30 kHz. In some embodiments, the TAG lens 370 may very rapidly adjust or modulate the focus position FP (e.g., periodically, at a rate of at least 70 kHz, 400 kHz or much higher). In some embodiments, the TAG lens 370 may be driven using a periodic signal such that the focus position FP is modulated sinusoidally over time, at a high frequency.

According to various embodiments, the TAG lens imaging system 300 under control of the SLPCRC 131e is operable in a first mode of exposure control corresponding to a points from focus (PFF) mode and in a second mode of exposure control corresponding to an extended depth of focus (EDOF) mode.

Figure 6:
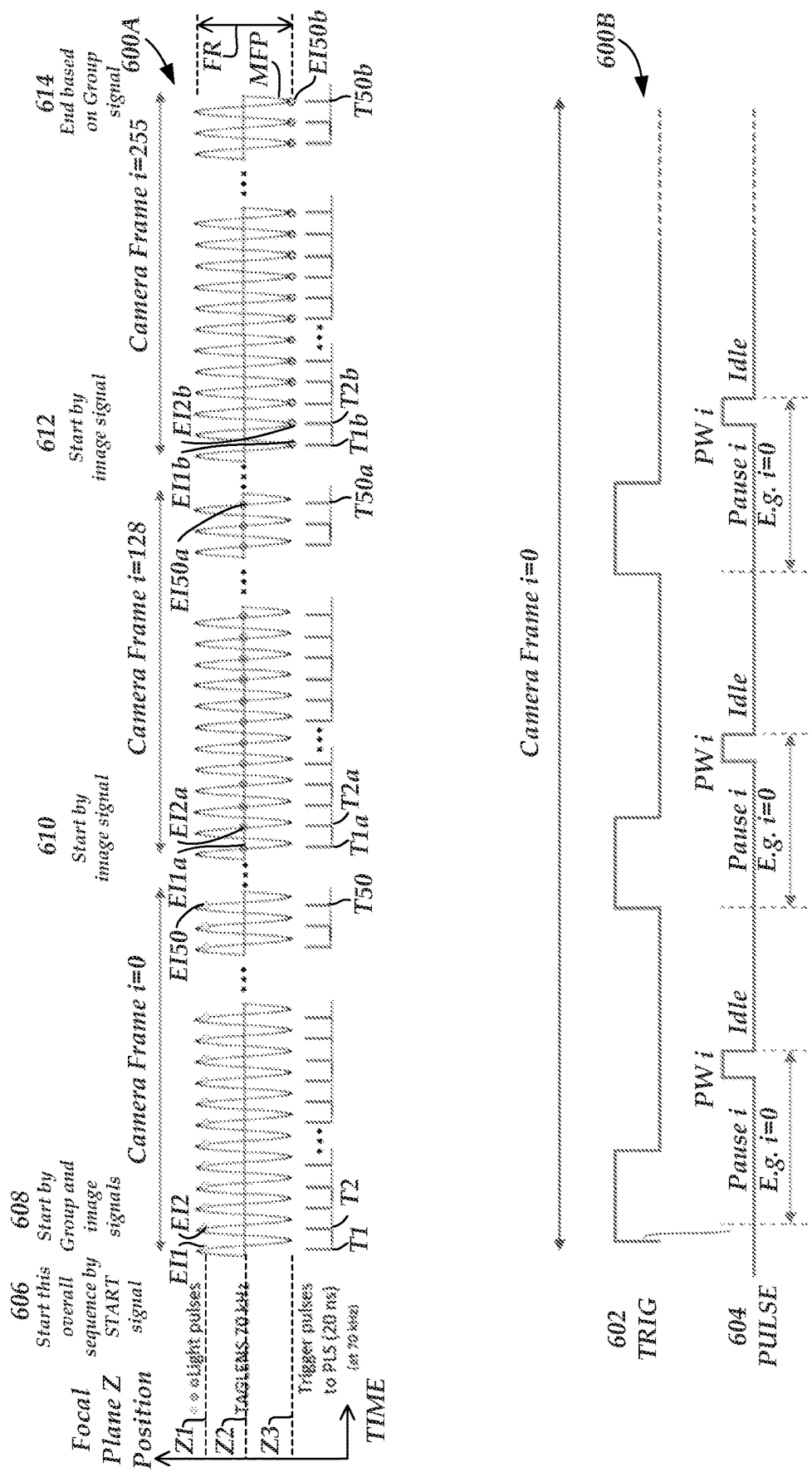
FIG. 6 shows an exemplary timing diagram for a focal height during an image exposure as may be used in one embodiment of the TAG lens imaging system operating in the PFF mode according to principles disclosed herein.
Figure 7:
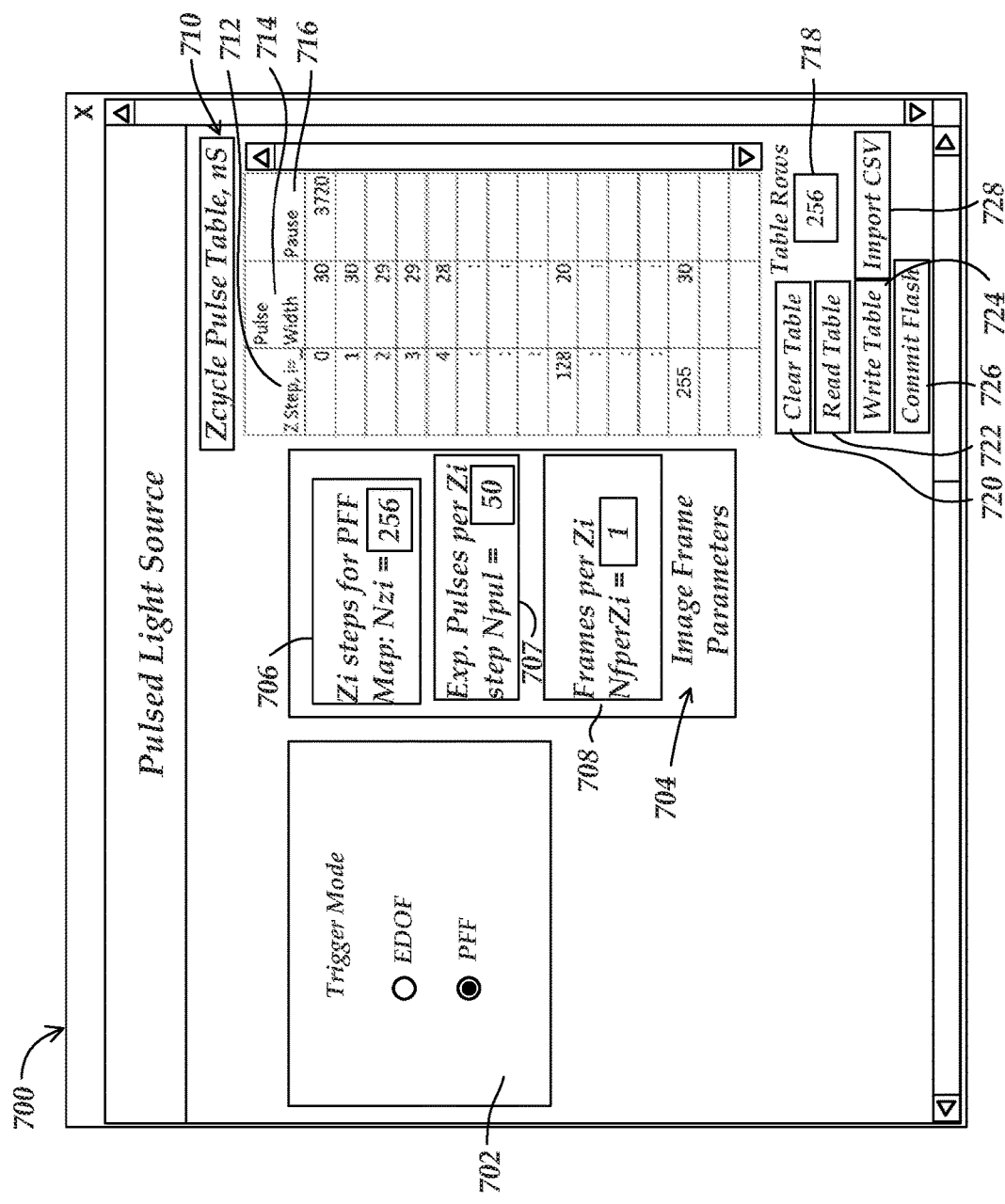
FIG. 7 shows an exemplary graphical user interface represented as a screen shot of a display device associated with the TAG lens imaging system, which allows user control (e.g., user input) of a PFF exposure control data set that defines a PFF image exposure sequence used to expose an image stack in the PFF mode.

In the PFF mode, the TAG lens imaging system 300 is operated to expose a stack of images (an image stack) using an exposure sequence defined by a PFF exposure control data set that is included in or input to the SLPCRC 131e. A sample PFF image exposure sequence is illustrated in FIGS. 6 and 7 and will be more fully described below. The PFF image exposure sequence defines a plurality of discrete image exposure increments acquired at respective discrete focus positions FP corresponding to respective phases of the periodically modulated focus position. The plurality of discrete image exposure increments are each determined by a respective instance of an illumination source strobe operation that has a respective controlled timing defined in the PFF image exposure sequence. The image stack is processed to determine or output a Z height coordinate map (e.g. a point cloud) that quantitatively indicates a set of 3 dimensional surface coordinates corresponding to a surface shape of the workpiece 20.

Figure 8:
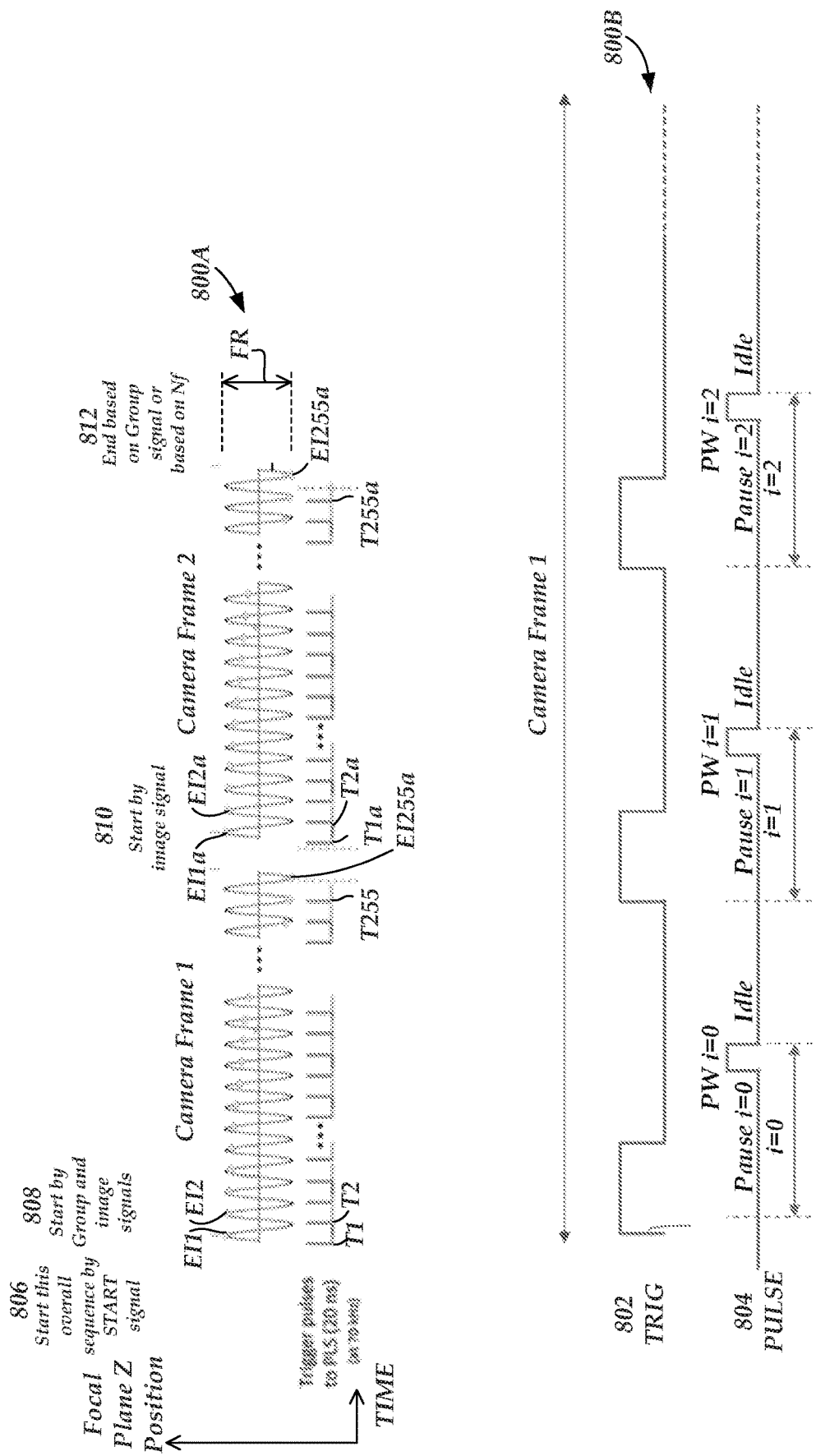
FIG. 8 shows an exemplary timing diagram for a focal height during an image exposure as may be used in one embodiment of the TAG lens imaging system operating in the EDOF mode according to principles disclosed herein.
Figure 9:
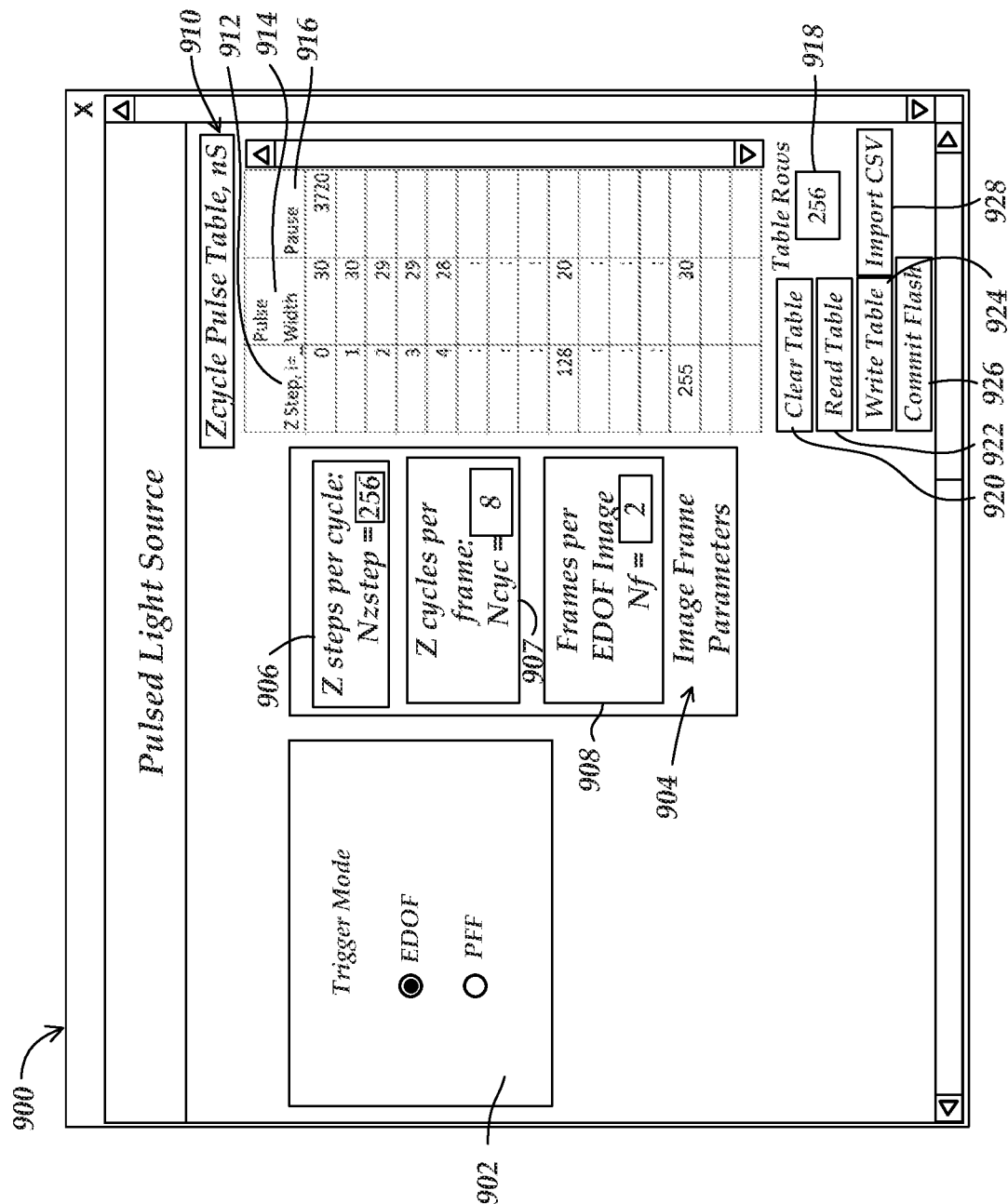
FIG. 9 shows an exemplary graphical user interface represented as a screen shot of a display device associated with the TAG lens imaging system, which allows user control (e.g., user input) of an EDOF exposure control data set that defines an EDOF image exposure sequence used to expose a preliminary image in the EDOF mode.

In the EDOF mode, the TAG lens imaging system 300 is operated to expose a preliminary image using an exposure sequence defined by an EDOF exposure control data set that is included in or input to the SLPCRC 131e. A sample EDOF image exposure sequence is illustrated in FIGS. 8 and 9 and will be more fully described below. The EDOF image exposure sequence defines a plurality of discrete image exposure increments acquired at respective discrete focus positions FP corresponding to respective phases of the periodically modulated focus position. The plurality of discrete image exposure increments are each determined by a respective instance of an illumination source strobe operation that has a respective controlled timing defined in the EDOF image exposure sequence. The preliminary image is processed to determine or output an EDOF image that has a larger depth of field than the TAG lens imaging system in a single focal position (e.g., 10-20 times larger, or more, in various embodiments), wherein the EDOF image is substantially focused throughout the larger depth of field. In various embodiments, the EDOF image may be provided at a high rate, suitable for display approximately in real time. For example, the EDOF image exposure sequence may be configured to acquire the preliminary image in less than 500 msec, or less than 250 msec, or less than 100 msec, or less than 50 msec.

Figure 4:
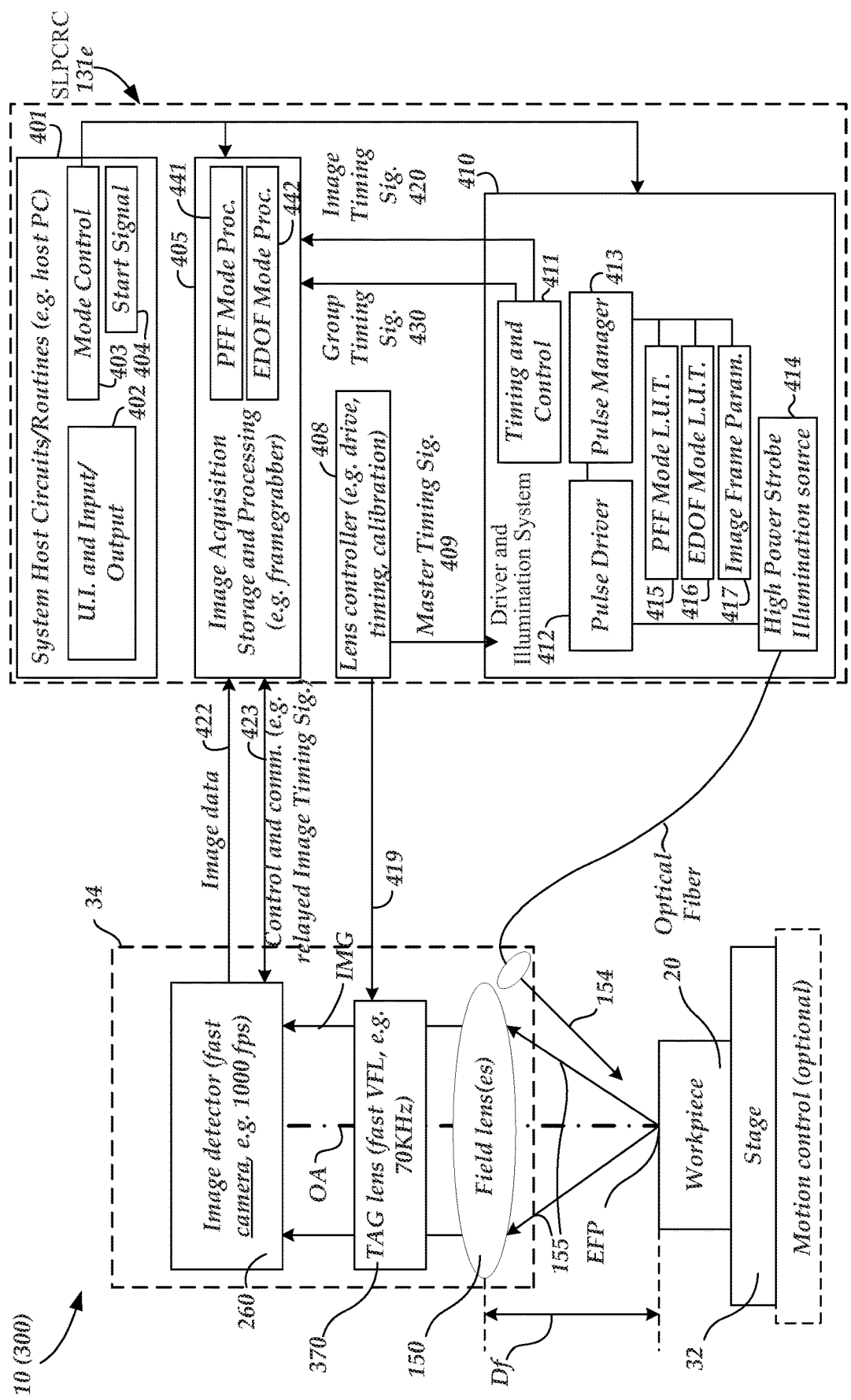
FIG. 4 is a block diagram of an optical imaging system portion and a control system portion of the TAG lens imaging system controlled by a smart lighting pulse control routine/circuit (SLPCRC) which embodies a high-power fast-pulse driver and illumination system according to principles disclosed herein.

FIG. 4 is a block diagram of the TAG lens imaging system 10 (300) including an optical imaging system 34, a workpiece stage 32, and an SLPCRC 131e operable as a control system for the TAG lens imaging system 10. In various implementations, the TAG lens imaging system 10 may be adapted to a machine vision host system, or used as a standalone system, and may be operated according to principles disclosed herein and in the incorporated references.

The optical imaging system 34 includes an image detector 260 (e.g., a camera), one or more field lenses 150 (e.g., the objective lens 350 and the relay lenses 351 and 352 in FIG. 3), and a TAG lens 370. The SLPCRC 131e may include system host circuits and routines 401, which may be provided in a host PC for example. The system host circuits and routines 401 include a user interface input/output module 402 (e.g., various display devices or input devices 16, 18, 22, 24, 26 in FIG. 1), and a mode control module 403 configured to control operation of the TAG lens imaging system 10 in the PFF mode and in the EDOF mode. In some embodiments, the mode control module 403 may be responsible for defining a PFF image exposure sequence based on a PFF exposure control data set, and for defining an EDOF image exposure sequence based on an EDOF exposure control data set. In some embodiments, a user may define the PFF exposure control data set or the EDOF exposure control data set using an exemplary graphical user interface as shown in FIGS. 7 and 9, based on which the SLPCRC 131e using suitable algorithms may generate a corresponding PFF image exposure sequence or a corresponding EDOF image exposure sequence, respectively. The PFF image exposure sequence defines a plurality of discrete image exposure increments acquired at respective discrete focus positions FP corresponding to respective phases of the periodically modulated focus position, and the plurality of discrete image exposure increments are each determined by a respective instance of an illumination source strobe operation that has a respective controlled timing defined in the PFF image exposure sequence. The EDOF image exposure sequence defines a plurality of discrete image exposure increments acquired at respective discrete focus positions corresponding to respective phases of the periodically modulated focus position, and the plurality of discrete image exposure increments are each determined by a respective instance of an illumination source strobe operation that has a respective controlled timing defined in the EDOF image exposure sequence.

The SLPCRC 131e may be configured such that, in either the PFF mode or the EDOF mode, input of a start signal 404, via the user interface input/output module 402 for example, may initiate a predetermined sequence of the PFF image sequence or of the EDOF image sequence, to provide an entire image stack for the PFF or an entire preliminary image for the EDOF mode, as will be more fully described below.

In some implementations the workpiece stage 32 may comprise an (optional) motion control system that moves the workpiece 20 relative to the optical imaging system 34. In such implementations, the system host circuits and routines 401 may include a workpiece program generator and executor (not shown), that operates the motion control system and other features of the TAG lens imaging system 10, to automatically inspect the workpiece 20, as disclosed in the incorporated references.

The SLPCRC 131e may also include image acquisition storage and processing circuits and routines 405, a lens controller 408 (e.g., the lens control interface 134 in FIG. 2), and the driver and illumination system 410. The lens controller 408 may include a lens focus driving routine/circuit, lens focus timing routine/circuit, lens focus calibration routine/circuit, or the like, which may be used to control operation of the TAG lens 370 in the PFF mode or the EDOF mode. As previously outlined, the optical power of the TAG lens 370 changes continuously at a high frequency in response to a resonant drive signal (e.g., as input on a signal line 419 from the lens controller 408). In various implementations, the drive signal is a sinusoidal AC signal at a resonant frequency of operation of the TAG lens 370. The effective focus position EFP of the optical imaging system 34 changes accordingly. A focal length corresponding to an effective focus position EFP is available at a corresponding time or "phase timing" during the sinusoidal change of the optical power of the TAG lens 370. In various embodiments, the lens controller 408 generates master timing signal 409 (e.g., 70 kHz) which controls the operation of the SLPCRC 131e according to principles disclosed herein. In the embodiment illustrated in FIG. 4, the master timing signal 409 is input to the driver and illumination system 410.

The driver and illumination system 410 includes a timing and control module 411, a pulse driver 412, a pulse manager 413, and a high-power strobe illumination source 414 (e.g., the light sources 220, 230, and 240 in FIG. 2). The high-power strobe illumination source 414 may be strobed at a particular phase or "phase timing" of the modulation cycle to obtain an image exposure focused at a corresponding effective focus position EFP or focus distance. The pulse driver 412, based on the master timing signal 409 input from the lens controller 408, may drive the high-power strobe illumination source 414, in accordance with the PFF image exposure sequence or the EDOF image exposure sequence defined by the system host circuits and routines 401 described above. In this regard, the PFF image exposure sequence may be stored in a PFF mode look up table (LUT) storage 415 and the EDOF image exposure sequence may be stored in an EDOF mode look up table (LUT) storage 416, both under the control of the pulse manager 413. For example, a plurality of PFF image exposure sequences and a plurality of such EDOF image exposure sequences may be stored in the PFF mode LUT storage 415 and the EDOF mode LUT storage 416, from which one PFF image exposure sequence or one EDOF image exposure sequence may be selected and executed in response to the start signal 404 input from the system host circuits and routines 401. The pulse manager 413 may also include an image frame parameter storage 417 configured to store one or more PFF exposure control data sets, based on which one or more PFF image exposure sequences may be defined, and to store one or more EDOF exposure control data sets, based on which one or more EDOF image exposure sequences may be defined.

The pulse driver 412, in cooperation with the pulse manager 413, drives the high-power strobe illumination source 414 and, to that end, the pulse driver 412 includes circuits and routines for controlling various image exposures synchronized with the periodic focus position modulation provided by the TAG lens 370 in accordance with the PFF image exposure sequence or the EDOF image exposure sequence. In some implementations, the pulse driver 412 and the pulse manager 413 may be merged and/or indistinguishable. The pulse driver 412 may control, for example, the selection, power, on/off switch, and strobe pulse timing for the high-power strobe illumination source 144. An exemplary circuit configuration of the driver and illumination system 410, including the pulse drive 412 and the pulse manager 413, will be described in detail in reference to FIGS. 10A-12 below.

As illustrated in FIG. 4, when the high-power strobe illumination source 144 is driven, strobe light 154 is reflected or transmitted as workpiece light 155 from/through the workpiece 20. The workpiece light 155 passes through the field lens(es) 150 and the TAG lens 370, and is gathered by the image detector 260 (e.g., a camera) for measurement or imaging. In various implementations, the image detector 260 may be a known charge coupled device (CCD) image sensor or other form of camera. An imaging optical path, for example along an optical path OA, comprises various optical components that convey the workpiece imaging light 155 from the workpiece 20 to the image detector 260. For example, the field lens(es) 150, TAG lens 370, and the image detector 260 may all be arranged with their optical axes aligned on the same optical axis OA that intersects with a surface of the workpiece 20. However, it will be appreciated that this implementation is intended to be exemplary only, and not limiting. More generally, the imaging optical path may include mirrors and/or other optical elements, and may take any form that is operational for imaging the workpiece 20 using the image detector 260 according to known principles.

A workpiece image exposure, which includes the image of the workpiece 20 ("image data") and which is captured by the image detector 260, is output on a signal line 422 to the imaging acquisition storage and processing circuits and routines 405. The output of image data on the signal line 422 may be in response to control signaling and communication output on a signal line 423 from the image acquisition storage and processing circuits and routines 405 to the image detector 260. The timing and control module 411 of the driver and illumination system 410, based on the master timing signal 409 input from the lens controller 408 and based on the PFF image exposure sequence or the EDOF image exposure sequence, generates and outputs an image timing signal 420 and a group (image group) timing signal 430 to the image acquisition storage and processing circuits and routines 405. In various embodiments, the image acquisition storage and processing circuits and routines 405 may be implemented as a field-programmable gate array (FPGA) integrated circuit (no external MCU needed). In various embodiments, the image acquisition storage and processing circuits and routines 405 incorporate a framegrabber configured to capture (i.e., "grab") individual frames (images) from a video stream obtained by the image detector 260 and store the captured frames (images). The image timing signal 420 and the group (image group) timing signal 430 from the driver and illumination system 410 may control the timings at which the framegrabber captures and/or stores the individual frames (images).

The image acquisition storage and processing circuits and routines 405 may include a PFF mode processing module 441 and an EDOF mode processing module 442. The PFF mode processing module 441 includes circuit/routines for controlling image acquisition, storage and processing of a stack (group) of images (frames) during the PFF mode using, for example, the framegrabber of the image acquisition storage and processing circuits and routines 405, and in accordance with the image timing signal 420 and the group timing signal 430 input from the driver and illumination system 410. The EDOF mode processing module 442 includes circuits/routines for controlling image acquisition, storage and processing of a group of images (frames) during the EDOF mode using, for example, the framegrabber, and in accordance with the image timing signal 420 and the group timing signal 430.

As described above, when the TAG lens imaging system 10 is operated in the PFF mode, a stack of images (an image stack) are exposed according to a PFF image exposure sequence, and the image stack is processed to determine or output a Z height coordinate map (e.g., a point cloud) that quantitatively indicates a set of 3 dimensional surface coordinates corresponding to a surface shape of the workpiece 20.

Known contrast-based focus analysis methods may be used to analyze the stack of images and determine whether they are in focus. Alternatively, or in addition, such contrast-based focus analysis methods may be used to identify a best-focus image out of a set of images acquired at a corresponding set of known phase timings, and to output that "best-focus" phase timing value. Z-height (effective focus position EFP) calibration data may be utilized that relates respective Z-heights or effective focus positions EFP to respective "best-focus" phase timings, and the surface height coordinate of an imaged surface portion of the workpiece 20 may be determined based on the phase timing associated with its "best focus" image. Thus, the TAG lens imaging system 10 in the PFF mode may be used to measure or profile 3 dimensional surface coordinates of a surface shape of the workpiece 20 by scanning across it. Various aspects of such measuring processes are described in greater detail in the incorporated references.

In various implementations, the user interface input/output module 402 of the system host circuits and routines 401 may be used to output the z height coordinate map determined in the PFF mode. Such image exposure and processing including the displaying may be controlled by the PFF mode processing module 441. In some implementations, the image stack may be input to the framegrabber included in the SLPCRC 131e, and the processing of the image stack may be performed in a processor included in the framegrabber, such that the Z height coordinate map is output from the framegrabber (e.g., for display on the user interface input/output module 402) and the image stack is not output from the framegrabber. In various implementations, the PFF image exposure sequence is configured to acquire the image stack at a high rate, such as in less than 1 sec, or less than 500 msec, or less than 250 msec. In various implementations, the respective controlled timings for the plurality of discrete image exposure increments used to acquire the image stack are defined as a predetermined sequence in the PFF image exposure sequence, and the SLPCRC 131e is configured to provide the entire image stack based on a single start signal 404 that initiates the predetermined sequence.

In various implementations, at least a portion of the SLPCRC 131e is included in the driver and illumination system 410 of the TAG lens imaging system 10, and at least a portion of the PFF exposure control data set that defines the PFF image exposure sequence is included in or input to the driver and illumination system 410 (e.g., in the image frame parameter storage 417). In various other implementations, at least a portion of the SLPCRC 131e may be included in the framegrabber of the TAG lens imaging system 10 (e.g., in the framegrabber of the image acquisition storage and processing circuits and routines 405), and at least a portion of the PFF exposure control data set is included in or input to the framegrabber.

The image detector 260 may be "strobed" at a particular phase or "phase timing" of the modulation cycle of the TAG lens 370 to obtain an image exposure focused at a corresponding effective focus position EFP or focus distance. Control signaling and communication, such as a trigger signal to "strobe" the image detector 260 at a particular image timing, may be output on the signal line 423 from the image acquisition storage and processing circuits and routines 405 to the image detector 260. In some implementations, the PFF mode processing module 441 and the EDOF mode processing module 442 each may include a timing controller such that the camera image exposure timing is synchronized with a desired phase timing of the TAG lens focus position modulation and/or an illumination timing in accordance with the PFF image exposure sequence or with the EDOF image exposure sequence. For example, in exposing a PFF image stack, each discrete image exposure increment may be determined by a respective instance of image acquisition by a framegrabber of the TAG lens imaging system 10 according to the PFF image exposure sequence. In various implementations, the image detector (e.g., camera) 260 may be triggered for each instance of the image acquisition according to the PFF image exposure sequence.

A trigger signal to the image detector 260 may be sent from the framegrabber and/or from the driver and illumination system 410 of the TAG lens imaging system 10.

In some implementations, in exposing a PFF image stack, each discrete image exposure increment is determined by a respective instance of image storage (recording) in a framegrabber of the TAG lens imaging system 10 according to the PFF image exposure sequence. For example, the image detector (e.g., camera) 260 may be continually triggered to continually output images to the framegrabber, but only the respective instances of images corresponding to the plurality of discrete image exposure increments according to the PFF image exposure sequence are stored (recorded) in the framegrabber.

As described above, when the TAG lens imaging system 10 is operated in the EDOF mode, a preliminary image is exposed using an EDOF image exposure sequence, and the preliminary image is processed to determine or output an EDOF image that has a larger depth of field than the TAG lens imaging system 10 in a single focal position, wherein the EDOF image is substantially focused throughout the larger depth of field.

Known integration and deconvolution methods may be used to expose a preliminary image during an image integration time while modulating the focus position FS in the focus range R, and to remove blurred image contributions to provide an EDOF image that is substantially focused through the larger depth of field. Various aspects of such EDOF imaging processes are described in greater detail in the incorporated references.

In various implementations, the user interface input/output module 402 of the system host circuits and routines 401 may be used to output the EDOF image of the workpiece 20, approximately in real time. In some implementations, a plurality of EDOF images may be provided and displayed in a live video display window coupled to the user interface input/output module 402.

Such image exposure and processing may be controlled by the EDOF mode processing module 442. In some implementations, the preliminary image may be input to the framegrabber included in the SLPCRC 131e, and the processing of the preliminary image may be performed in a processor included in the framegrabber, such that the EDOF image is output from the framegrabber (e.g., for display on the user interface input/output module 402) and the preliminary image is not output from the framegrabber. In various implementations, the EDOF image exposure sequence is configured to acquire the preliminary image at a high rate, such as in less than 500 msec, or less than 250 msec, or less than 100 msec, or less than 50 msec. In various implementations, the respective controlled timings for the plurality of discrete image exposure increments used to acquire the preliminary image are defined as a predetermined sequence in the EDOF image exposure sequence, and the SLPCRC 131e is configured to provide the entire preliminary image based on a single start signal 404 that initiates the predetermined sequence.

In various implementations, at least a portion of the SLPCRC 131e is included in the driver and illumination system 410 of the TAG lens imaging system 10, and at least a portion of the EDOF exposure control data set that defines the EDOF image exposure sequence is included in or input to the driver and illumination system 410 (e.g., in the image frame parameter storage 417). In various implementations, at least a portion of the SLPCRC 131e may be included in the framegrabber of the TAG lens imaging system 10 (e.g., in the framegrabber of the image acquisition storage and processing circuits and routines 405), and at least a portion of the EDOF exposure control data set is included in or input to the framegrabber.

It should be noted that each of the various components, circuits, routines, and modules of the SLPCRC 131e described above in reference to FIG. 4 may be interconnected by one or more data/control busses and/or application programming interfaces, or by direct connections between the various elements. While the SLPCRC 131e is illustrated as including, or formed of, the system host circuits and routines 401, the image acquisition storage and processing circuits and routines 405, the lens controller 408, and the driver and illumination system 410 in FIG. 4, the SLPCRC 131e may be included in one or more of these elements or in one or more other elements of the TAG lens imaging system 10 not illustrated in FIG. 4, in any non-distributed or distribute manner to support the operation of the TAG lens imaging system 10 in the PFF mode and in the EDOF mode according to principles disclosed herein.

FIG. 5 is a flow diagram 500 showing one embodiment of a method for operating a TAG lens imaging system 10 including the SLPCRC 131e that provides the PFF mode and the EDOF mode.

In step 501, a smart lighting pulse control routine/circuit (SLPCRC) 131e is provided, which supports a first mode of exposure control corresponding to the PFF mode the TAG lens imaging system 10 and a second mode of exposure control corresponding to the EDOF mode of the TAG lens imaging system 10.

In step 503, a workpiece 20 is placed in a field of view of the TAG lens imaging system 10.

In step 505, a focus position FP of the TAG lens imaging system 10 is periodically modulated without macroscopically adjusting the spacing between elements in the TAG lens imaging system 10. The focus position FP is periodically modulated over a plurality of focus positions FP along a focus axis direction in a focus range R including a surface height of the workpiece 20, at a modulation frequency of at least 30 kHz.

In step 507, the TAG lens imaging system 10 is operated by activating the PFF mode at a first operating period of time.

In step 509, optionally, the TAG lens imaging system 10 is operated by activating the EDOF mode at a second operating period of time.

FIG. 6 shows an exemplary timing diagram 600A for a focal height during an image exposure as may be used in one embodiment of the TAG lens imaging system 10 operating in the PFF mode according to principles disclosed herein. The timing diagram 600A shows the periodically modulated focus position MFP of the variable focus TAG lens imaging system 10, which is periodically modulated (as shown along the time axis) over a plurality of focus positions FP along a focus axis direction (as shown along the focal plane Z position axis), over a focus range FR. The timing diagram 600A additionally shows exposure times of a camera (e.g., the image detector 260) as "Camera frame i=0," "Camera frame i=128," and "Camera frame i=255" (while camera frames i=1-127 and i=129-254 between these illustrated camera frames are not shown to omit unnecessary details). Generally, the timing diagram 600A represents the exposure of stack of images (the image stack) that results from the PFF image exposure sequence defined by an PFF exposure control data set that is included in or input to the SLPCRC 131e. The PFF image exposure sequence defines a plurality of discrete image exposure increments (e.g., $EI_1$-$EI_{50}$, $EI_{1a}$-$EI_{50a}$ and $EI_{1b}$-$EI_{50b}$ in the example illustrated in FIG. 6) that are acquired at respective discrete focus positions FP corresponding to respective phases of the periodically modulated focus position MFP. For example, $EI_1$-$EI_{50}$ are acquired at focus position Z1, $EI_{1a}$-$EI_{50a}$ are acquired at focus position Z2, and $EI_{1b}$-$EI_{50b}$ are acquired at focus position Z3, respectively. The reference abbreviations EI may include an index numeral "i", which designates a particular "ith" exposure increment EI corresponding to a particular focus position. The plurality of discrete image exposure increments $EI_1$-$EI_{50}$, $EI_{1a}$-$EI_{50a}$ and $EI_{1b}$-$EI_{50b}$ are each determined by a respective instance of an illumination source strobe operation (indicated as a circle placed on a sinusoidal wave representative of the periodically modulated focus position MFP in FIG. 6), which may be an instance of an illumination source strobe operation, a camera shutter strobe operation, a framegrabber acquisition/storage operation, etc., as described above, and which has a respective controlled timing (T1-T50, T1a-T50a, and T1b-T50b in FIG. 6) defined in the PFF image exposure sequence.

FIG. 7 shows an exemplary graphical user interface (GUI) 700 represented as a screen shot of a display device associated with the TAG lens imaging system (e.g., the user interface input/output module 402), which allows user control (e.g., user input) of an PFF exposure control data set that defines an PFF image exposure sequence used to expose a stack of images in the PFF mode. The GUI 700 includes a switch 702, which is selected to activate the TAG lens imaging system 10 in the PFF mode. The GUI 700 includes an image frame parameters field 704, which includes a Zi steps for PFF map ("Nzi") field 706, an exposure pulses per Zi step ("Npul" field") 707, and a frames per Zi ("NfperZi") field 708 in the illustrated example. In various embodiments, the PFF exposure control data set, which is used to define the PFF image exposure sequence, may be a set of parameters such as those entered in the image frame parameters field 704 in the example of FIG. 7.

In the GUI 700 of FIG. 7, a user/operator may define a total number of Zi steps defined for a stack of images in the Zi steps for PFF map ("Nzi") field 706, which is "256" in this example. In various examples, the Nzi number corresponds to the number of rows shown in a "Table Rows" field 718 of a frame pulse table 710, as will be described below. In various embodiments, a frame exposure is performed corresponding to at least one exposure pulse at a particular focal height ("Zi") of the TAG lens imaging system 10, and the number of exposure pulses per Zi step is shown in the exposure pulses per Zi step ("Npul" field") 707. When multiple exposure pulses are defined per Zi, the results from the multiple exposure pulses can be combined (e.g., averaged, or the results from different X-Y positions being mosaicked, etc.) to form one image (frame) per Zi. FIG. 7 illustrates Npul=50 in 707, which corresponds to 50 instances of exposure pulses that are used to provide 50 image exposure increments per Zi (e.g., $EI_1$-$EI_{50}$ at Z1, $EI_{1a}$-$EI_{50a}$ at Z2, and $EI_{1b}$-$EI_{50b}$ at Z3 in the example illustrated in FIG. 6). A user/operator may specify, in the frames per Zi ("NfperZi") field 708 in the GUI 700, at least one frame per Zi, which can be combined (e.g., averaged) to form one image per Zi. In the illustrated example, the user/operator specified NfperZi=1, meaning that one frame is acquired per Zi, as shown in FIG. 6.

In various embodiments, the PFF image exposure sequence defined by the PFF exposure control data set is represented in the form of the frame pulse table 710 in FIG. 7, which lists "Z step, i=" 712, a pulse width 714, and a pause 716, all in the units of nanosecond (nS), for each of a total number of images that form a stack of images (e.g., total "256" images that consist of camera frames i=0-255, as shown in the "Table Rows" field 718). Thus, in the example of FIG. 7, the PFF image exposure sequence defines 256 frames (images), which form one stack of images, indexed as Z step, i=0-255 (in 712), wherein image exposure at each Z step (at each Z focus position) is associated with a particular light pulse width (in 714) and a pause before the light pulse (in 716).

Referring additionally back to FIG. 6, a pulse diagram 600B is provided below the timing diagram 600A, which illustrates the timings of a master timing signal 602 (e.g., 70 kHz) output from the lens controller 408 (see FIG. 4) and an image exposure pulse 604 for exposing the stack of images (e.g., 256 images) in the PFF mode. The pulse diagram 600B illustrates that an image exposure at a first focus position "Z step, i=0" (in 712) is triggered by the master timing signal 602, followed by a corresponding pause time period (in 716), followed by a light exposure having a defined pulse width (in 714), which is then followed by an idle time period, before the next image exposure at the same focus position ("Z step, i=0) is triggered by another master timing signal 602, for the "Npul=50" number of times (i.e., the number of times the image exposure is repeated at "Z step, i=0"). Then, "i" is incremented by 1, and the image exposure sequence in accordance with the master timing signal 602 and the image exposure pulse 604 is repeated for the "Npul=50" number of times at Z step, i=1. The same image exposure sequence is repeated for Z step, i=2-255, in a similar manner.

In FIG. 6, the PFF image exposure sequence as graphically represented in the timing diagram 600A may be started by a single start signal 404 (see FIG. 4) at time 606, and a frame exposure for "Camera frame i=0" may be started by the image timing signal 420 and the group timing signal 430 generated by the SLPCRC 131e (FIG. 4) at time 608. After camera frames i=1-127 are exposed (not illustrated), a frame exposure for "Camera frame i=128" may be started by the image timing signal 420 at time 610. After camera frames i=129-254 are exposed (not illustrated), a frame exposure for "Camera frame i=255" may be started by the image timing signal 420 at time 612. After the entire stack of images (e.g., total 256 images at Z=0-255) are exposed, the PFF image exposure sequence ends based on the group timing signal 430 at time 614. Generally, the image timing signal 420 controls start and/or end of an image exposure (or a frame exposure) and the group timing signal 430 controls start and/or end of exposing a stack (or group) of images used in the PFF mode. In the embodiment illustrated in FIG. 4, the imaging timing signal 420 and the group timing signal 430 corresponding to the PFF image exposure sequence are generated by the timing and control module 411 of the driver and illumination system 410, though these timing signals 420 and 430 may be generated by any components associated with the SLPCRC 131e according to principles disclosed herein.

In some embodiments, an PFF image exposure sequence, as represented in the frame pulse table 710 for example, may be explicitly, manually, or semi-manually defined by a user/operator by filling out the frame pulse table 710, for example. Additionally or alternatively, in various implementations, an PFF image exposure sequence may be algorithmically generated based on an PFF exposure control data set that is included in or input to the SLPCRC 131e, for example in the image frame parameters field 704 of the GUI 700 shown in FIG. 7. In this connection, the GUI 700 of FIG. 7 further includes radio buttons labeled "Clear Table" 720, "Read Table" 722, "Write Table" 724, "Commit Flash" 726, and "Import CSV" 728. In exemplary implementations, the "Clear Table" 720 button clears the frame pulse table 710 currently shown, the "Read Table" 722 button reads a predefined PFF image exposure sequence out of one or more predefined PFF image exposure sequences stored in a memory device (e.g., the PFF mode look up table (LUT) storage 415 in FIG. 4), and "Import CSV" 728 button imports a predefined PFF image exposure sequence from a machine vision inspection system associated with the TAG lens imaging system 10. The "Write Table" 724 button permits a user/operator to write a new PFF image exposure sequence in the frame pulse table 710, in volatile memory in various implementations. The "Commit Flash" 726 button stores (commits) a newly-written PFF image exposure sequence into non-volatile memory such as flash memory (e.g., the PFF mode look up table (LUT) storage 415 in FIG. 4), which can later be retrieved in the TAG lens imaging system 10 operating in the PFF mode.

Because the TAG lens imaging system 10 operating in the PFF mode according to the principles disclosed herein offers high speed 3D mapping of a surface shape of a workpiece, such an imaging system may be utilized to repetitively collect the 3D surface coordinates of the workpiece at a high rate and its 3D mapping may be displayed as real-time video frames.

FIG. 8 shows an exemplary timing diagram 800A for a focal height during an image exposure as may be used in one embodiment of the TAG lens imaging system 10 operating in the EDOF mode according to principles disclosed herein. The timing diagram 800A shows the periodically modulated focus position MFP of the variable focus TAG lens imaging system 10, which is periodically modulated (as shown along the time axis) over a plurality of focus positions FP along a focus axis direction (as shown along the focal plane Z position axis), over a focus range FR. The timing diagram 800A additionally shows exposure times of a camera (e.g., the image detector 260) as "Camera frame—Frame 1" and "Camera frame—Frame 2". Generally, the timing diagram 800A represents the exposure of preliminary image(s) that results from the EDOF image exposure sequence defined by an EDOF exposure control data set that is included in or input to the SLPCRC 131e. The EDOF image exposure sequence defines a plurality of discrete image exposure increments (e.g., $EI_1$-$EI_{255}$ and $EI_{1a}$-$EI_{255a}$ in the example illustrated in FIG. 8) that are acquired at respective discrete focus positions FP corresponding to respective phases of the periodically modulated focus position MFP. The reference abbreviations EI may include an index numeral "i", which designates a particular "ith" exposure increment EI corresponding to a particular focus position. The plurality of discrete image exposure increments $EI_1$-$EI_{255}$ and $EI_{1a}$-$EI_{255a}$ are each determined by a respective instance of an illumination source strobe operation (indicated as a circle placed on a sinusoidal wave representative of the periodically modulated focus position MFP in FIG. 8), which may be an instance of an illumination source strobe operation, a camera shutter strobe operation, a framegrabber acquisition/storage operation, etc., as described above, and which has a respective controlled timing (T1-T255 and T1a-T255a) defined in the EDOF image exposure sequence.

FIG. 9 shows an exemplary graphical user interface (GUI) 900 represented as a screen shot of a display device associated with the TAG lens imaging system (e.g., the user interface input/output module 402), which allows user control (e.g., user input) of an EDOF exposure control data set that defines an EDOF image exposure sequence used to expose a preliminary image in the EDOF mode. The GUI 900 includes a switch 902, which is selected to activate the TAG lens imaging system 10 in the EDOF mode. The GUI 900 includes an image frame parameters field 904, which includes a Z steps per cycle ("Nzstep") field 906, a Z cycles per frame ("Ncyc" field") 907, and a frames per EDOF image ("Nf") field 908 in the illustrated example. In various embodiments, the EDOF exposure control data set, which is used to define the EDOF image exposure sequence, may be a set of parameters such as those entered in the image frame parameters field 904 in the example of FIG. 9. In various embodiments, the EDOF image exposure sequence defined by the EDOF exposure control data set is represented in the form of a Zcycle pulse table 910, which lists "Z step, i=" 912, a pulse width 914, and a pause 916, all in the units of nanosecond (nS), for each of a total number (e.g., "256") of discrete image exposure increments per each frame ($EI_1$-$EI_{255}$ or $EI_{1a}$-$EI_{255a}$ in FIG. 8) shown in a "Table Rows" field 918. In the example of FIG. 9, the EDOF image exposure sequence defines 256 image exposure increments EI per each frame, indexed as Z step, i=0-255, wherein each image exposure increment EI is associated with a particular light pulse width (in 914) and a pause before the light pulse (in 916).

Referring additionally back to FIG. 8, a pulse diagram 800B per each frame is provided below the timing diagram 800A (for two frames), wherein the pulse diagram 800B illustrates the timings of a master timing signal 802 (e.g., 70 kHz) output from the lens controller 408 (see FIG. 4) and an image exposure pulse 804, per each frame. The pulse diagram 800B illustrates that each image exposure increment EI at "Z step, i=" (in 912) is triggered by the master timing signal 802, followed by a corresponding pause time period (in 916), followed by a light exposure having a defined pulse width (in 914), which is then followed by an idle time period, before the next image exposure increment EI (at "Z step, i=" where "i" is incremented by 1) is triggered by another master timing signal 802. While the pulse diagram 800B illustrates the pulse signaling for only the initial three image exposure increments $EI_1$-$EI_3$ at Z step, i=0, 1, and 2, respectively, it should be understood that the pulse diagram 800B continues for all of the image exposure increments defined for each frame, $EI_1$-$EI_{256}$ at Z step, i=0-255, respectively, in the illustrated example.

In the GUI 900 of FIG. 9, a user/operator may define a total number of Z steps per periodic modulation cycle, in the Z steps per cycle ("Nzstep") field 906, which is "256" in this example. In various examples, the Nzstep number corresponds to the number of rows shown in the "Table Rows" field 918, in the Zcycle pulse table 910, as illustrated. In various embodiments, a frame exposure is performed corresponding to at least one cycle ("Z cycle") of a periodic modulation of the focal height of the TAG lens imaging system 10 over a desired focus range FR, and the number of Z cycles per frame is shown in the Z cycles per frame ("Ncyc" field") 907. When multiple Z cycles are performed per frame, the results from the multiple Z-cycle exposures can be combined (e.g., averaged) to form one preliminary image (or preliminary frame). While FIG. 9 illustrates Ncyc=8 in 907, the timing diagram 800A and the pulse diagram 800B in FIG. 8 illustrate an example where Ncyc=1, for the purpose of clear illustration. A user/operator may specify, in the frames per EDOF image ("Nf") field 908 in the GUI 900, at least one preliminary image (preliminary frame), which can be processed to form one EDOF image that has a larger depth of field and that is substantially focused throughout the larger depth of field. In the illustrated example, the user/operator specified Nf=2, meaning that two preliminary images (preliminary frames) are processed (combined, averaged, etc.) to form an EDOF image, as shown in the timing diagram 800A of FIG. 8.

In FIG. 8, the EDOF image exposure sequence as graphically represented in the timing diagram 800A may be started by a single start signal 404 (see FIG. 4) at time 806, and a frame exposure for "Frame 1" may be started by the image timing signal 420 and the group timing signal 430 generated by the SLPCRC 131*e* (FIG. 4) at time 808. A frame exposure for "Frame 2" may be started by the image timing signal 420 at time 810. Because two preliminary images are processed to form one EDOF image in the illustrated example (e.g., "Nf=2" in 908), after the exposure of "Frame 2," the EDOF image exposure sequence ends based on the group timing signal 430 (or based on the value of Nf) at time 812. Generally, the image timing signal 420 controls start and/or end of an image exposure (or a frame exposure) and the group timing signal 430 controls start and/or end of an entire EDOF image exposure sequence (e.g., exposing a group of preliminary images) to acquire one EDOF image, in various embodiments. In the embodiment illustrated in FIG. 4, the imaging timing signal 420 and the group timing signal 430 corresponding to the EDOF image exposure sequence are generated by the timing and control module 411 of the driver and illumination system 410, though these timing signals 420 and 430 may be generated by any components associated with the SLPCRC 131*e* according to principles disclosed herein.

In some embodiments, an EDOF image exposure sequence, as represented in the Zcycle pulse table 910 for example, may be explicitly, manually, or semi-manually defined by a user/operator by filling out the Zcycle pulse table 910, for example. Additionally or alternatively, in various implementations, an EDOF image exposure sequence may be algorithmically generated based on an EDOF exposure control data set that is included in or input to the SLPCRC 131*e*, for example in the image frame parameters field 904 of the GUI 900 shown in FIG. 9. In this connection, the GUI 900 of FIG. 9 further includes radio buttons labeled "Clear Table" 920, "Read Table" 922, "Write Table" 924, "Commit Flash" 926, and "Import CSV" 928. In exemplary implementations, the "Clear Table" 920 button clears the Zcycle pulse table 910 currently shown, the "Read Table" 922 button reads a predefined EDOF image exposure sequence out of one or more predefined EDOF image exposure sequences stored in a memory device (e.g., the EDOF mode look up table (LUT) storage 416 in FIG. 4), and "Import CSV" 928 button imports a predefined EDOF image exposure sequence from a machine vision inspection system associated with the TAG lens imaging system 10. The "Write Table" 924 button permits a user/operator to write a new EDOF image exposure sequence in the Zcycle pulse table 910, in volatile memory in various implementations. The "Commit Flash" 926 button stores (commits) a newly-written EDOF image exposure sequence into non-volatile memory such as flash memory (e.g., the EDOF mode look up table (LUT) storage 416 in FIG. 4), which can later be retrieved in the TAG lens imaging system 10 operating in the EDOF mode.

Because the TAG lens imaging system 10 operating in the EDOF mode according to the principles disclosed herein offers high-speed extended depth-of-field imaging, such an imaging system may be utilized to repetitively collect EDOF images at a high rate, e.g., for video imaging at 30 frames per second or higher, and the plurality of EDOF may be displayed as real-time video frames.

Figure 10A:
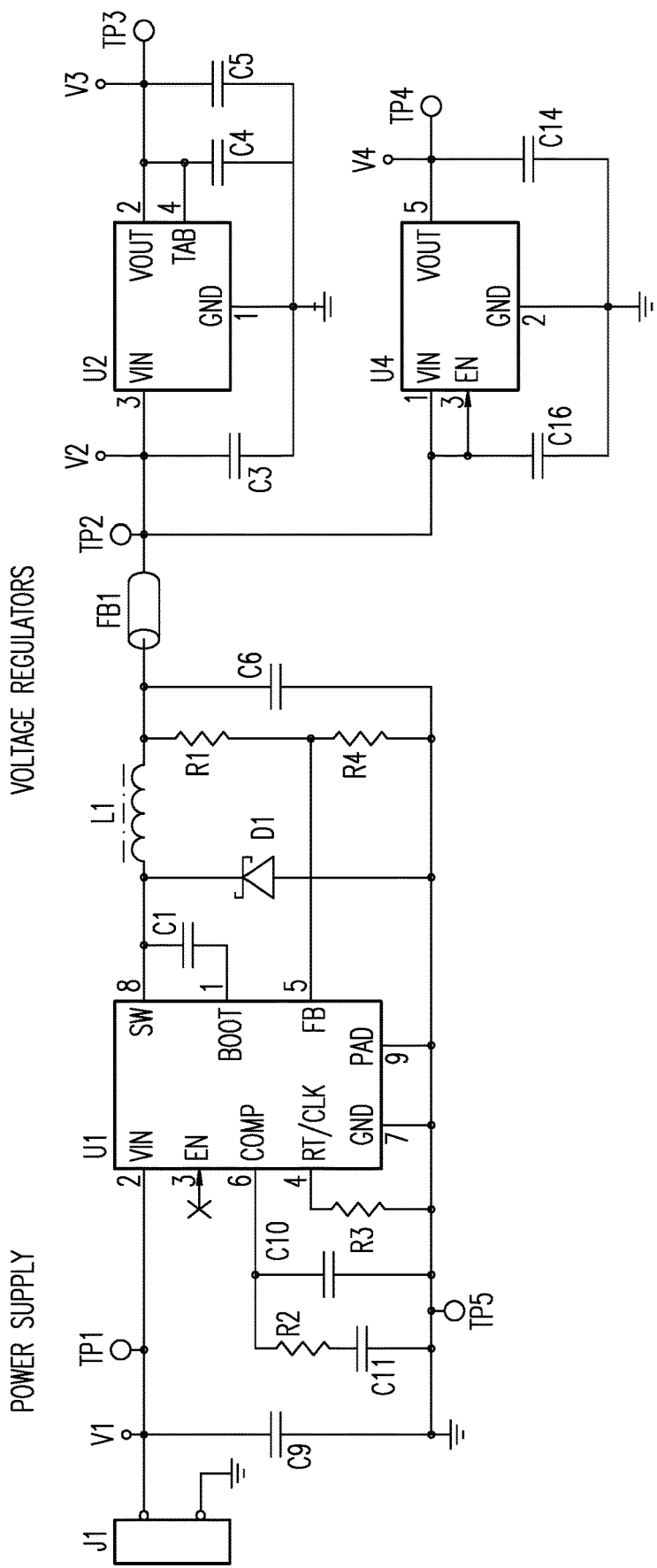
FIGS. 10A and 10B are a circuit schematic including one implementation of a driver and illumination system suitable for forming the smart lighting pulse control routine/circuit (SLPCRC) according to principles disclosed herein.
Figure 10B:
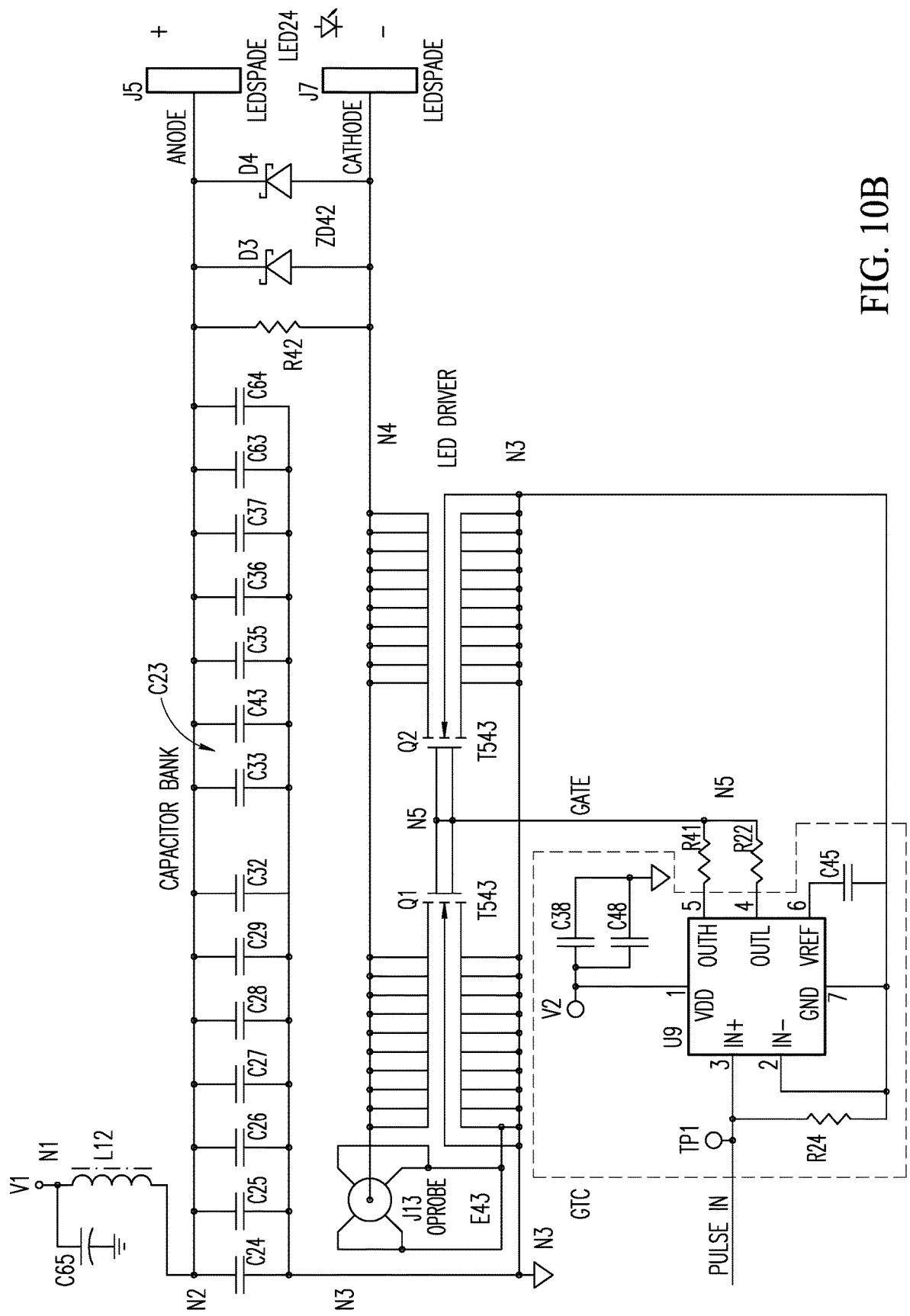
Figure 11:
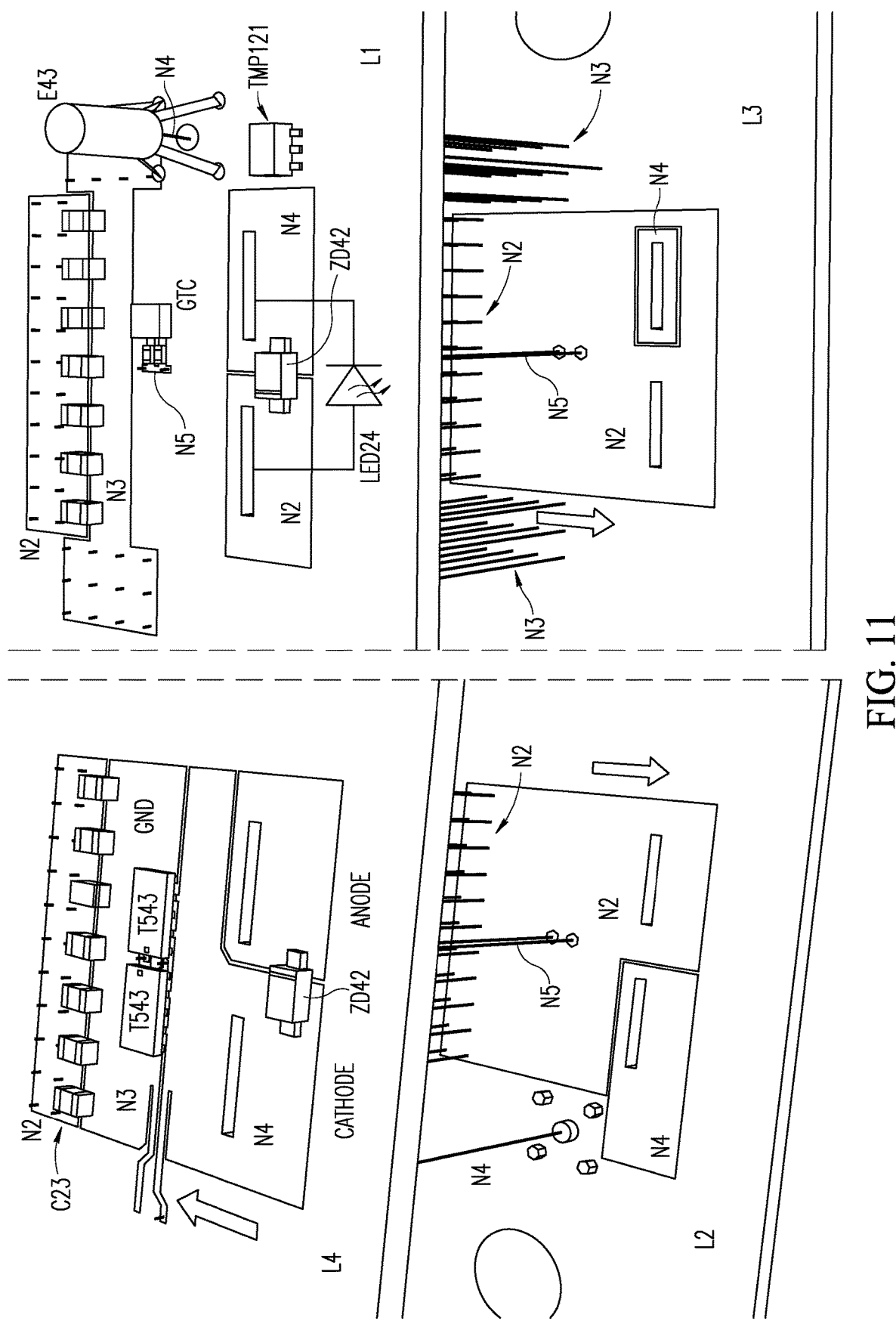
FIG. 11 is a partially schematic isometric type view of one layout for implementing the circuit schematic of FIG. 10B in a printed circuit board, wherein the layout implementation is shown on four layers, L1-L4.
Figure 12:
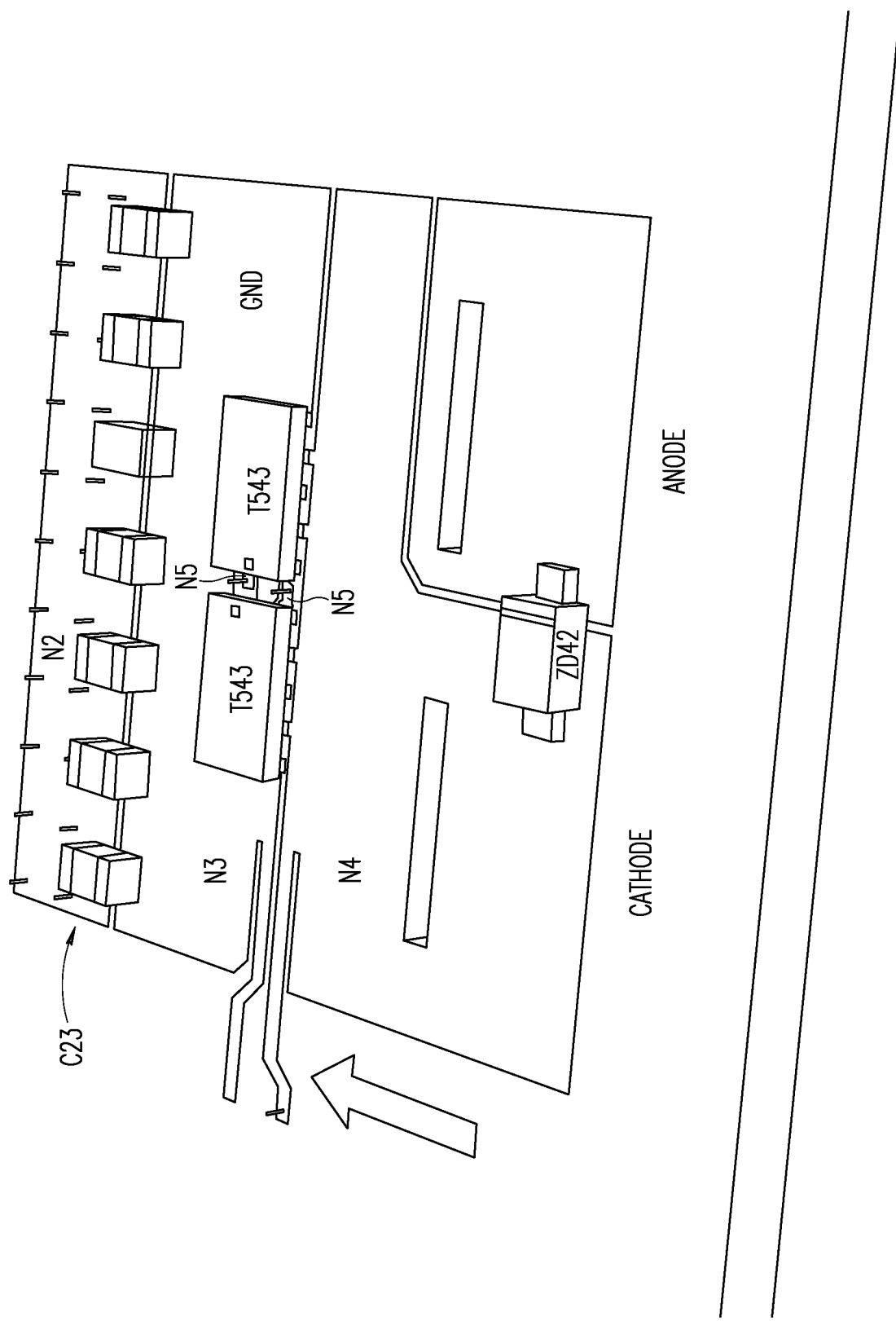
FIG. 12 is a close-up view of a portion on layer L4 of FIG. 11, showing certain features with additional detail.

FIG. 10A is a circuit schematic of one implementation of a power supply and voltage regulators for use with the driver and illumination system 410, and FIG. 10B is a circuit schematic including one implementation of the driver and illumination system 410 of the smart lighting pulse control routine/circuit (SLPCRC) 131*e* of FIG. 4, according to principles disclosed herein. FIG. 11 is a partially schematic isometric type view of one layout for implementing the circuit schematic of FIG. 10B in a printed circuit board according to principles disclosed herein. In the particular implementation of FIG. 11, the layout is shown on four layers, L1-L4, in a compact multilayer printed circuit board layout. Layers L1 and L3 on the right side of FIG. 11 are horizontally flipped to correspond to layers L4 and L2 on the left side of FIG. 11. FIG. 12 is a close-up view of a portion on layer L4 of FIG. 11, showing certain features with additional detail.

In FIGS. 10A-12, a convention is used wherein certain circuit nodes N1-N5 disclosed in FIG. 10B are numbered the same in FIGS. 11 and 12. Components or component groups connected between those nodes are numbered or named accordingly. For example, element E43 is connected between nodes N4 and N3. In one specific example implementation of FIG. 10A, the components may have values/types such as the following: J1=02B-EH; V1=24V; C9=2.2UF; R2=18.7K; C11=2NF; C10=56PF; R3=226K; C1=0.1UF; L1=SDR1105-330KL; R1=60.4K; D1=B560C; R4=11.5K; FB1=600 (1.3 A); C6=47UF; V2=5V; C3=0.1UF; C16=1UF; V3=3.3V; C4=0.1UF; C5=10UF; V4=1.2V; C14=1UF. In one specific example implementation of FIG. 10B, the components may have values/types such as the following: V1=24V; C24=0.22UF; C25=0.22UF; C26=0.22UF; C27=0.22UF; C28=0.22UF; C29=0.22UF; C32=0.22UF; C33=0.22UF; C43=0.22UF; C35=0.22UF; C36=0.22UF; C37=0.22UF; C63=0.22UF; C64=0.22UF; C65=150UF; L12=6UH; R42=102K; V2=5V, R24=200K; C38=1UF; C48=0.1UF; R41=1.00K; R22=4.99K; C45=0.1UF. An inductor L12 is used in a sample embodiment of FIG. 10B. In the prior art, it is more common that a resistor is used instead of an inductor at an analogous location in a circuit. In contrast, the inductor L12 provides certain advantages not achievable with a resistor. For example, a resistor is typically a major source of heat, which may be disadvantageous in various applications.

C23 is disclosed as a capacitor bank. This provides certain advantages in layout and/or operating characteristics relative to a single capacitor, for example. Nevertheless, in other implementations, fewer or more capacitors may be used for C23.

ZD42 is disclosed as two zener diodes. This provides certain advantages in layout and/or operating characteristics relative to a single diode, or a diode of a different type. Nevertheless, in other implementations, fewer or more diodes of a different type may be used for ZD42.

T543 is disclosed as two Gallium Nitride FET transistors. This provides certain advantages in layout and/or operating characteristics relative to a transistor, or a transistor of a different type. In some implementations, a PCB layout according to principles disclosed herein reduces circuit inductance to an extent that allows use of voltage-sensitive GaN FETs which provide higher efficiency and speed. Nevertheless, in other implementations, fewer or more transistors of a different type may be used for T543.

A gate trigger circuit GTC is disclosed in FIG. 10B, for receiving pulse control signals PULSE IN (e.g. for an FPGA), and providing related pulse signals having the appropriate levels and characteristics to T543 at node N5. The configuration of the gate trigger circuit GTC is exemplary only, and not limiting.

In reference to FIGS. 10A-12, one example of the high-power fast-pulse driver and illumination system 410 is disclosed. The driver and illumination system 410 are particularly useful for overdriving an LED high-power strobe illumination source 414, to provide incoherent illumination, though the driver and illumination system 410 may be used in combination with other devices in some applications.

In relation to using the driver and illumination system 410 with a TAG lens imaging system 10, it can be shown that it is desirable to acquire a measurement image wherein the change in focus plane during the acquisition is on the order of 0.2 or 0.25 of the depth of focus. In some useful optical configurations, this may require pulse lengths in a range as short at 12-80 nanoseconds. The driver and illumination system 410 disclosed herein can provide pulse durations on this order—e.g. down to 10 nS duration, with 5 nS adjustment resolution.

The driver and illumination system 410 disclosed herein can be operated in various operating modes (e.g. in the PFF mode and in the EDOF mode as described above, or at various supply voltages and/or pulse lengths), for compatibility or optimization for various different applications.

In one implementation, an LED used to form the high-power strobe illumination source 414 may have a 9 square millimeter (mm$^2$) emitting area, or more, to provide high brightness illumination. The driver and illumination system may be configured to overdrive it with very high currents (e.g. 50-250 A, such as 220 A) and/or current densities (e.g., 5-12 A/mm$^2$, such as 11 A/mm$^2$). It may be operated at low duty cycles (e.g. 1-2% or less) to preserve its operating lifetime. Additionally or alternatively, a different technique may be employed to preserve the operating lifetime, such as operating the light source in a burst mode at higher duty cycles close to 10% for short intervals.

Figure 13:
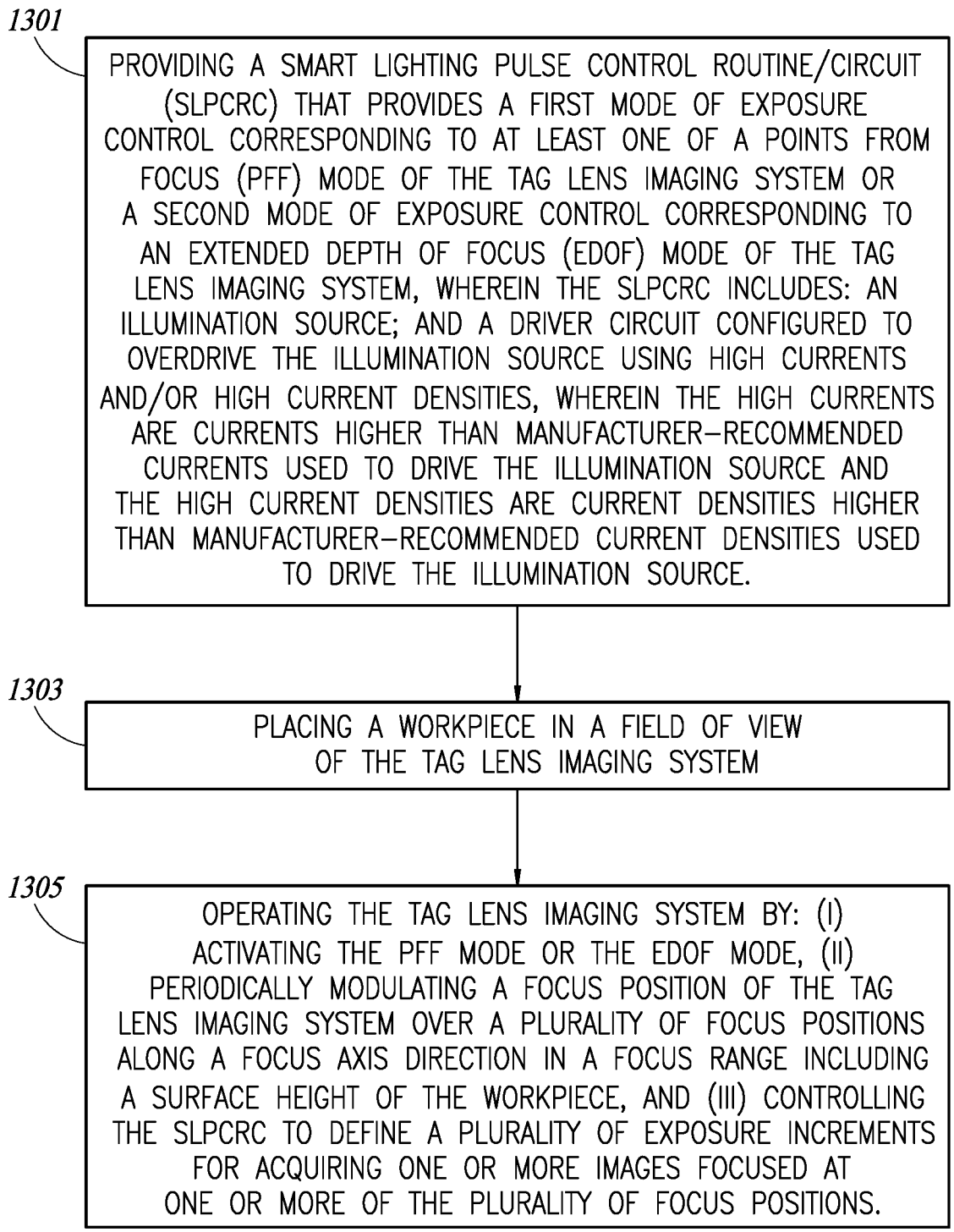
FIG. 13 is a flow diagram showing one embodiment of a method for operating a TAG lens imaging system including the driver and illumination system according to principles disclosed herein.

FIG. 13 is a flow diagram showing one embodiment of a method for operating a TAG lens imaging system including the driver and illumination system according to principles disclosed herein.

Step 1301 includes providing a smart lighting pulse control routine/circuit (SLPCRC) that provides a first mode of exposure control corresponding to at least one of a points from focus (PFF) mode of the TAG lens imaging system or a second mode of exposure control corresponding to an extended depth of focus (EDOF) mode of the TAG lens imaging system, wherein the SLPCRC includes: an illumination source; and a driver circuit configured to overdrive the illumination source using high currents and/or high current densities, wherein the high currents are currents higher than manufacturer-recommended currents used to drive the illumination source and the high current densities are current densities higher than manufacturer-recommended current densities used to drive the illumination source.

Step 1303 includes placing a workpiece in a field of view of the TAG lens imaging system. Step 1305 includes operating the TAG lens imaging system by: (i) activating the PFF mode or the EDOF mode, (ii) periodically modulating a focus position of the TAG lens imaging system over a plurality of focus positions along a focus axis direction in a focus range including a surface height of the workpiece, and (iii) controlling the SLPCRC to define a plurality of exposure increments for acquiring a single image focused at the plurality of focus positions, or a plurality of images focused at the plurality of focus positions, respectively, or a single image focused at a single focus position.

In contrast to commercially available short-pulse LED driver circuits, which use expensive and potentially dangerous voltage supplies on the order of 100 volts, the disclosed driver and illumination system 410 may use voltage supplies on the order of 24 volts or less. In some implementations, the driver and illumination system 410 may use Gallium Nitride FETs as transistors T543 (see FIGS. 10A-12), in combination with such supply voltages.

In various implementations, the driver and illumination system 410 disclosed herein is configured without the need for a current limiting resistor and its associated detrimental effects on the operating goals of the driver and illumination system. Instead, the current limit may be established by using a particular power supply voltage (e.g. the particular voltage 21V, in one implementation) in a circuit configuration which guarantees that no more current than desired is available. For example, 24V may be a typical choice, but 21V may be specially configured and intentional, in relation to providing a desired maximum current in exemplary applications of the present disclosure. In some implementations, in order to configure the power supply with internal current protection that prevents long-term damage, the circuit configuration of the driver and illumination system 410 is configured to switch from a higher pulse rate mode to a slower pulse rate mode in case of over-current, e.g., in relation to FET failure. Furthermore, the driver and illumination system 410 may be configured for pulse control by a pulse generator to limit driver pulse width(s) to a safe level(s), instead of resorting to the known technique of using a limiting resistor to limit current and/or power levels. Stated one way, in some implementations, power pulse duration is limited to limit average power over a particular time span, whereas the power or current within the pulse duration is not subject to the action of a current limiting resistor. Pulse duration and rate are integrated factors that determine voltage, power dissipation, etc.

In various implementations, the driver and illumination system 410 disclosed herein is configured without the need for a current "sense" resistor (not to be confused with a current limiting resistor) and its associated detrimental effects on the operating goals of the driver and illumination system. For example, a current sense resistor, though typically not a significant source of heat, adds undesirable inductance to the high-current loop, producing slower rise time, requiring longer pulse widths, and producing FET-damaging inductive kickback.

In various implementations, the driver and illumination system 410 disclosed herein is implemented using innovative PCB layout configurations, configured to reduce circuit inductance to a minimum—even down to the smallest details that are not generally recognized or significant in the prior art. Compared to known driver and illumination systems, this allows faster rise times, smaller pulse widths, and lower spike voltage on the FET, while allowing very high pulse current for the LED. It should be appreciated that known state of the art systems, e.g. as disclosed in U.S. Pat. No. 9,603,210, which is hereby incorporated herein by reference in its entirety, have exhausted known techniques in order to provide the state-of-the-art performance. As outlined in the Background above, this performance is inadequate for a number of applications. To provide the performance achieved according to principles disclosed herein requires the consideration of the impedance characteristics and loop areas created by many or all of the PCB circuit traces that are used to implement the circuit, in conjunction with the currents that flow through those traces, and their direction relative to one another, and the like. Of course, this also depends at least partially on the configuration of the circuit components, and component choices, to be connected by the PCB traces. Thus, in some implementations, the particular types and/or values of certain components, and their combinations disclosed herein are particularly important to achieving the performance outlined herein. The elimination or exclusion of various components or design approaches used in prior art system may be particularly important in this regard, in some implementations. In some implementations, the particular configuration of individual traces and/or their layout with respect to one another in all 3 dimensions (e.g. their routing on one or more circuit layers and so on) disclosed herein are particularly important to achieving the performance outlined herein. Of course, routing and component selection are independent. Therefore, in some implementations the combination of various components, and/or component values, and/or design principles, and/or the layout of their connecting traces and/or their relationship to one another in 3 dimensions (e.g. in a multilayer PCB arrangement), in combinations and configurations disclosed herein, are particularly important to achieving the performance disclosed herein. It will be appreciated that the compactness of layouts disclosed herein is also one aspect of its layout in 3 dimensions that affects performance, in some implementations.

It will be appreciated that the combinations and configurations disclosed herein, may be particularly important to achieving the performance disclosed herein, with unprecedently economy and compactness.

In some implementations, the driver and illumination system 410 may be controlled by pulses from an FPGA that can provide pulse generation at 5 nS, 200 MHz.

In FIG. 11, the traces that provide various nodes are shown to comprise wide plate-like or planar areas. In contrast to ground planes that are configured to extend across broad areas for the purpose of shielding and/or shunt unwanted stray signals, in the present disclosure, various node traces in FIG. 11 are widened beyond conventional practices to minimize certain loop areas between certain traces, and/or lower their associated resistance and/or inductance, and/or distribute current flow in such traces in a desirable way. According to these principles, in some implementations at least some of the node traces are configured to reduce their spacing to adjacent node traces to a practical minimum on one or more of the layers. According to these principles, in some implementations, at least some of the node traces are configured as plate or planar configurations that occupy as much as 5% or 10%, or more, of a "total footprint" of a driver circuit compact layout (e.g. the projected area that includes all of the node traces shown in FIG. 11).

In some implementations, according to principles disclosed here, at least some node traces are configured to extend under components that they connect to, in order to in effect reduce the loop area that would otherwise occur between such components and traces other than the nodes traces that those components are connected to.

In some implementations, different node traces that carry respective currents that flow along directions, which are partially or wholly opposite to one another, may be located on layers that are relatively closer to one another, which minimizes the 3-dimensional loop area therebetween. In some implementations, different node traces that carry respective currents that flow along similar directions may be located on layers that are relatively farther from to one another (e.g. in comparison to the aforementioned "opposite" current node traces), in that the relatively larger 3-dimensional loop area therebetween has less consequence for the circuit behavior when the currents that flow in them flow in the same direction. When used herein, the term "loop area" may refer to partially formed or incomplete loops. The point is related to the interaction between traces in terms of the associated electrical characteristics and is not limited to the strict interpretation of the geometry that may be associated with various terms in the geometric or mathematical sense. As one example of this principle, in the particular layout disclosed in FIG. 11, current flows (shown by arrows in layers L2, L3, and L4) are directed away from the LED24 (in layer L1) on layer 4, and towards the LED24 on layers 3 and 2. The thin pre-impregnated material separating layers 4 and 3, with currents flowing in opposite directions, minimizes the inductance of the loop formed on layers 4 and 3. On the other hand, the currents flow in the same direction on layer 2 and 3, nullifying any inductance between those two layers.

In various implementations, the LED24 (shown schematically, not actually, in FIG. 11, layer L1) may be directly inserted through slots in the PCB, not using the standard sockets, reducing inductance.

In various implementations, circuits and layouts according to principles disclosed herein have demonstrated performance characteristic similar to or better (e.g., brighter/faster) than the following combination of incoherent pulsed illumination, including:

Generates over 100 A current pulses for the LED (Prior art 40-50 A).

Provides 10-80 nanosecond duration current pulses (Prior art microsecond(s) @ 40 A).

Provides at least 140 kHz repetition rates.

Limits the duty cycle to 1.12% (or more or lower in some implementations) to preserve LED lifetime (Prior art 13%).

Generates peak power of 12 W/pulse (~1 µJ/pulse) in the field of view of a microscope. (Prior art approximately 12 W, but using 50Ax20 microsecs, not using 1 microsecond or less).

It will be appreciated that the specific component values shown in various figures provide one implementation that may provide the performance outlined herein. However, in other configurations, other component values may be used for various components, and various benefits disclosed herein may still be provided.

While various embodiments of the invention have been illustrated and described, numerous variations in the illustrated and described arrangements of features and sequences of operations will be apparent to one skilled in the art based on this disclosure. Thus, it will be appreciated that various changes can be made therein without departing from the spirit and scope of the invention.

Further aspects and explanation of the circuits, layouts, LEDs, and companion controls systems and optical systems outlined above are explained in greater detail in the attached appendices, which may be taken in combination with the features and principles outlined above to provide one of ordinary skill in the are a full understanding of the various potential implementations or embodiments of the invention disclosed herein, as well as the associated features, benefits and performance.

The invention claimed is:

1. A high-power fast-pulse driver and illumination system for high speed metrology imaging, comprising:
   an illumination source; and
   a driver circuit configured to overdrive the illumination source using high currents and/or high current densities, wherein the high currents are currents higher than manufacturer-recommended currents used to drive the illumination source and the high current densities are current densities higher than manufacturer-recommended current densities used to drive the illumination source;
   wherein the illumination source is configured to be operated using a lifetime preserving technique selected from a first technique of operating the illumination source at low duty cycles of 2% or less or a second technique of operating the illumination source in a burst mode at higher duty cycles for short intervals; and
   wherein at least one of:
   (a) the driver circuit includes: node N1 coupled to a power supply; node N2, coupled via an inductor L12 to node N1, and providing an anode for the illumination source; node N3, coupled via one or more capacitors C23 to node N2, and providing an input to receive control pulses for driving the illumination source; node N4, coupled via element E43 to node N3, coupled via one or more diodes D42 to node N2, and providing a cathode for the illumination source; and node N5, coupled to a gate trigger circuit GTS for receiving pulse control signals PULSE IN for driving the illumination source, and coupled via one or more transistors T543 to node N4 and to node N3; or
   (b) the driver and illumination system is implemented in a printed circuit board (PCB) layout configuration having particular configurations of individual components and layout with respect to one another in layers in 3 dimensions; and different node traces that carry respective currents that flow along partially or wholly opposite directions are located on layers that are relatively closer to one another, as viewed in a direction perpendicular to a plane of the PCB layout configuration; and different node traces that carry respective currents that flow along similar directions are located on layers that are relatively farther from one another, as viewed in the direction perpendicular to the plane of the PCB layout configuration.

2. The driver and illumination system of claim 1, wherein the driver circuit includes the elements indicated in (a).

3. The driver and illumination system of claim 2, wherein the one or more transistors T543 include Gallium Nitride FETs.

4. The driver and illumination system of claim 2, wherein the driver circuit is configured to perform pulse control to limit pulse width(s) of the pulse control signals PULSE IN to safe level(s) in case of an over-current instance.

5. The driver and illumination system of claim 2, wherein the driver circuit is configured to switch from operating in a higher pulse rate mode and to operating in a slower pulse rate mode in case of an over-current instance.

6. The driver and illumination system of claim 1, which is incorporated in a variable focus lens (VFL) system, wherein the driver and illumination system, in operation, defines multiple exposure increments for acquiring a single image focused at multiple focus planes of the VFL system, or multiple images focused at multiple focus planes of the VFL system, or a single image focused at a single focus plane of the VFL system.

7. The driver and illumination system of claim 6, wherein the VFL system is a tunable acoustic gradient (TAG) lens system.

8. The driver and illumination system of claim 6, wherein a change in focal plane during one of the exposure increments is on the order of 0.2 to 0.25 of a depth of focus (DOF) of the VFL system.

9. The driver and illumination system of claim 8, wherein a pulse length corresponding to one of the exposure increments is in a range of 12-80 nanoseconds.

10. The driver and illumination system of claim 8, wherein a pulse length corresponding to one of the exposure increments is 10 nanoseconds.

11. The driver and illumination system of claim 1, which is implemented as indicated in (b).

12. The driver and illumination system of claim 11, wherein at least some of node traces are configured as plate or planar configurations that occupy as much as 5% or 10% of a total footprint of the PCB layout configuration.

13. The driver and illumination system of claim 11, wherein at least some of node traces are configured to extend under components that the node traces connect to, as viewed in a direction perpendicular to a plane of the PCB layout configuration.

14. A tunable acoustic gradient (TAG) lens imaging system, comprising:
   (a) a smart lighting pulse control routine/circuit (SLPCRC) that provides at least one of a first mode of exposure control corresponding to a points from focus (PFF) mode of the TAG lens imaging system or a second mode of exposure control corresponding to an extended depth of focus (EDOF) mode of the TAG lens imaging system, wherein the SLPCRC includes: an illumination source; and a driver circuit configured to overdrive the illumination source using high currents and/or high current densities, wherein the high currents are currents higher than manufacturer-recommended currents used to drive the illumination source and the high current densities are current densities higher than manufacturer-recommended current densities used to drive the illumination source; and
   (b) a field of view that is configured to have a workpiece placed in the field of view; and
   wherein the TAG lens imaging system is configured to be operated by:
   activating the PFF mode or the EDOF mode,
   periodically modulating a focus position of the TAG lens imaging system over a plurality of focus positions along a focus axis direction in a focus range including a surface height of the workpiece, and
   controlling the SLPCRC to define a plurality of exposure increments for acquiring a single image focused at the plurality of focus positions, or a plurality of images focused at the plurality of focus positions, respectively, or a single image focused at a single focus position.

15. The system of claim 14, wherein the illumination source comprises one or more light emitting diodes (LEDs).

16. The system of claim 15, wherein the LEDs respectively have an emitter area of at least 9 mm$^2$ with a current density of 5-12 A/mm$^2$.

17. The system of claim 14, wherein the illumination source is driven with a power supply on the order of 24 volts or less.

18. The system of claim 17, wherein the power supply is on the order of 21 volts.

19. A method for operating a tunable acoustic gradient (TAG) lens imaging system, the method comprising:
(a) providing a smart lighting pulse control routine/circuit (SLPCRC) that provides at least one of a first mode of exposure control corresponding to a points from focus (PFF) mode of the TAG lens imaging system or a second mode of exposure control corresponding to an extended depth of focus (EDOF) mode of the TAG lens imaging system, wherein the SLPCRC includes: an illumination source; and a driver circuit configured to overdrive the illumination source using high currents and/or high current densities, wherein the high currents are currents higher than manufacturer-recommended currents used to drive the illumination source and the high current densities are current densities higher than manufacturer-recommended current densities used to drive the illumination source;
(b) placing a workpiece in a field of view of the TAG lens imaging system; and
(c) operating the TAG lens imaging system by:
activating the PFF mode or the EDOF mode,
periodically modulating a focus position of the TAG lens imaging system over a plurality of focus positions along a focus axis direction in a focus range including a surface height of the workpiece, and
controlling the SLPCRC to define a plurality of exposure increments for acquiring a single image focused at the plurality of focus positions, or a plurality of images focused at the plurality of focus positions, respectively, or a single image focused at a single focus position.

20. The method of claim 19, wherein a change in focal plane during one of the exposure increments is on the order of 0.2 to 0.25 of a depth of focus (DOF) of the TAG lens imaging system.

21. The method of claim 20, wherein a pulse length of the pulse control signal PULSE IN corresponding to one of the exposure increments is in a range of 12-80 nanoseconds.

* * * * *